United States Patent
Akurathi et al.

(10) Patent No.: US 11,664,800 B1
(45) Date of Patent: May 30, 2023

(54) CIRCUIT FOR AND METHOD OF IMPLEMENTING IO CONNECTIONS IN AN INTEGRATED CIRCUIT DEVICE

(71) Applicant: Xilinx, Inc., San Jose, CA (US)

(72) Inventors: VSS Prasad Babu Akurathi, Hyderabad (IN); Sabarathnam Ekambaram, Hyderabad (IN); Sasi Rama S. Lanka, Challapalli (IN); Hari Bilash Dubey, Hyderabad (IN); Milind Goel, Faridabad (IN)

(73) Assignee: XILINX, INC., San Jose, CA (US)

(*) Notice: Subject to any disclaimer, the term of this patent is extended or adjusted under 35 U.S.C. 154(b) by 121 days.

(21) Appl. No.: 16/511,925

(22) Filed: Jul. 15, 2019

(51) Int. Cl.
*H03K 17/687* (2006.01)
(52) U.S. Cl.
CPC ............................ *H03K 17/6872* (2013.01)
(58) Field of Classification Search
CPC ............. H03K 17/687; H03K 17/6871; H03K 17/6872; H03K 17/6874
See application file for complete search history.

(56) References Cited

U.S. PATENT DOCUMENTS

| | | | |
|---|---|---|---|
| 6,054,888 A * | 4/2000 | Maley | H03K 19/00315 326/68 |
| 7,468,616 B1 | 12/2008 | Kondapalli | |
| 8,519,771 B1 | 8/2013 | Cical | |
| 8,717,723 B2 | 5/2014 | Kireev | |
| 8,786,328 B2 * | 7/2014 | Sankaran | H03K 21/026 327/115 |
| 9,214,941 B2 | 12/2015 | Sewani | |
| 9,832,048 B2 | 11/2017 | Kireev | |
| 9,998,120 B1 | 6/2018 | Ekambaram | |
| 10,003,336 B1 | 6/2018 | Wang | |
| 2015/0123640 A1* | 5/2015 | Kondou | H02M 1/088 323/299 |
| 2018/0159513 A1* | 6/2018 | Reddy | H03K 3/35625 |
| 2019/0149149 A1* | 5/2019 | Pan | H01L 27/0924 327/109 |

FOREIGN PATENT DOCUMENTS

WO     2019055350     3/2019

* cited by examiner

*Primary Examiner* — Patrick C Chen
(74) *Attorney, Agent, or Firm* — Patterson + Sheridan, LLP

(57) ABSTRACT

A circuit for implementing an input/output connection in an integrated circuit device is described. The circuit comprises a pull-up circuit comprising a first plurality of transistors coupled in series, wherein a gate of a first transistor of the first plurality of transistors is configured to receive a first dynamic bias signal; a pull-down circuit comprising a second plurality of transistors coupled in series, the pull-down circuit being coupled to the pull-up circuit at an output node, wherein a gate of a first transistor of the second plurality of transistors is configured to receive a second dynamic bias signal; and an input/output contact coupled to the output node. A circuit for implementing an input/output connection in an integrated circuit device including a splitter circuit for receiving an input signal on an input pad is also described. A method of implementing an input/output connection in an integrated circuit device is also described.

18 Claims, 17 Drawing Sheets

CIRCUIT FOR AND METHOD OF IMPLEMENTING IO CONNECTIONS IN AN INTEGRATED CIRCUIT DEVICE

TECHNICAL FIELD

The present invention relates generally to integrated circuit devices, and in particular, to a circuit for and a method of implementing an input/output (IO) connection in an integrated circuit device.

BACKGROUND

As advancements continue to be made in integrated circuit devices, parameters associated with the device, including both parameters associated with external inputs (e.g. reference voltages) and parameter associated with the device itself (e.g. transistor dimensions), change. Integrated circuit devices have also changed in response to demands for higher frequencies. Many integrated circuits are configured to receive a wide range of input supply voltages at IO contacts, such as a contact pad of the integrated circuit device which may generally be referred to as IOs.

A common driver circuit in conventional devices may implement p-type metal oxide semiconductor (PMOS) devices and n-type metal semiconductor devices (NMOS) that are coupled in series, where a node of the series of transistors is coupled to an IO contact. The IO contact can be either driven high by PMOS transistors or driven low by NMOS transistors. However, as transistor technology shrinks, some of the transistors may undergo electrical stress depending on the supply voltage value, generally referred to as vcco.

Accordingly, there is a need for circuits and methods of implementing IO connections in integrated circuit devices that overcome deficiencies of conventional devices and may prevent damage to the transistors of the integrated circuit devices.

SUMMARY

A circuit for implementing an input/output connection in an integrated circuit device is described. The circuit comprises a pull-up circuit comprising a first plurality of transistors coupled in series, wherein a gate of a first transistor of the first plurality of transistors is configured to receive a first dynamic bias signal; a pull-down circuit comprising a second plurality of transistors coupled in series, the pull-down circuit being coupled to the pull-up circuit at an output node, wherein a gate of a first transistor of the second plurality of transistors is configured to receive a second dynamic bias signal; and an input/output contact coupled to the output node. The circuit may further comprise a bias signal generator having a first bias signal generator circuit for generating the first dynamic bias signal and a second bias signal generator circuit for generating the second dynamic bias signal.

Another circuit for implementing an input/output connection in an integrated circuit device comprising an input/output contact; a splitter circuit for receiving an input signal on the input/output contact, the splitter circuit comprising a first circuit for generating a first signal associated with the input signal based upon a first bias voltage and a second circuit for generating a second signals associated with the input signal based upon a second bias voltage; and a receiver circuit coupled to the output of the splitter circuit.

A method of implementing an input/output connection in an integrated circuit device is also described. The method comprises implementing a pull-up circuit comprising a first plurality of transistors coupled in series; configuring a gate of a first transistor of the first plurality of transistors to receive a first dynamic bias signal; coupling a pull-down circuit comprising a second plurality of transistors coupled in series to the pull-up circuit at an output node; configured a gate of a first transistor of the second plurality of transistors to receive a second dynamic bias signal; and coupling an input/output contact to the output node. The method may further comprise coupling a bias signal generator to the first pull-up circuit and the first pull-down circuit, the bias signal generator comprising a first bias signal generator circuit for generating the first dynamic bias signal and a second bias signal generator circuit for generating the second dynamic bias signal.

DETAILED DESCRIPTION

The circuits and methods set for below reduce or prevent damage to transistors having reduced dimensions, including transistors having reduced gate widths, such as 7 nm transistor technology. According to some implementations, the integrated circuit devices may include driver circuits having pull-up and pull-down transistor arrangements that are controlled by dynamic bias voltages, such as a pbias signal for p-type transistors and n-bias signal for n-type transistors. The pull-up and pull down circuits may comprise triple stack circuits that have three transistors coupled in series to generate an output signal on an input/output contact, such as an IO pad. The driver circuits for generating an output signal on an input/output contact may comprise a bias signal generator for generating the dynamic bias signals.

According to other implementations, an input/output connection in an integrated circuit device comprises a splitter circuit for receiving an input signal on the input/output contact, where the splitter circuit may comprise a first circuit for generating a first signal associated with the input signal based upon a first bias voltage and a second circuit for generating a second signal associated with the input signal based upon a second bias voltage. The input signal is split into first signal and the second signal in such a way that each split signal has a swing limit that is within a tolerable value to avoid damage to transistors of the integrated circuit device.

The circuits and methods for implementing an IO connection can be implemented in any IO device or IO circuit of an integrated circuit device, such as a general-purpose IO circuit for example. The circuits and methods not only reduce or prevent damage to transistors of an integrated circuit device, they also enable a higher frequency of operation.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
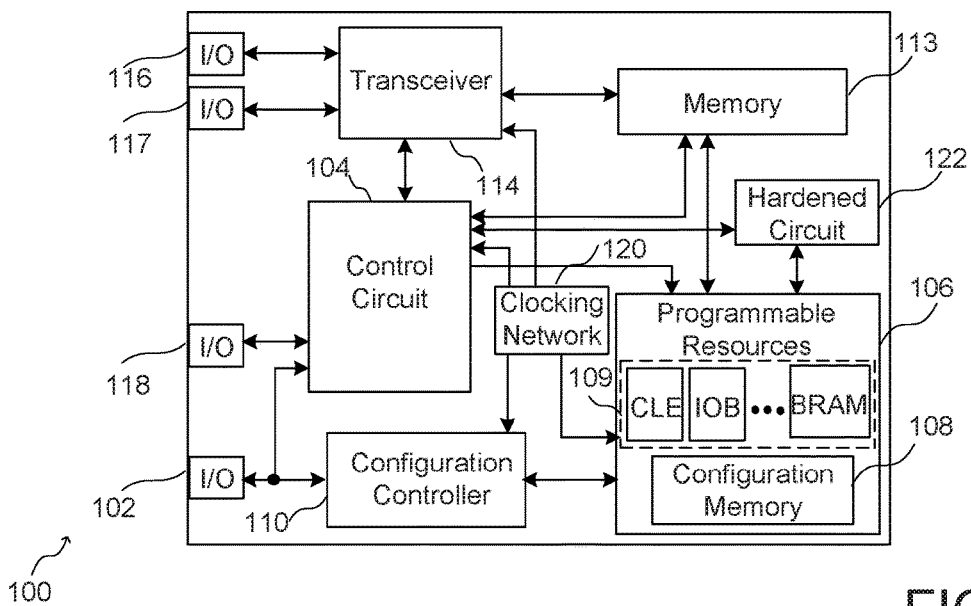
FIG. 1 is a block diagram of an exemplary integrated circuit device having input/output (IO) elements including IO contacts.

Turning first to FIG. 1, a block diagram of an exemplary integrated circuit device 100 having input/output (IO) elements is shown. In particular, an input/output circuit 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of IO circuits 116 and 117. Other IO circuits may be coupled to circuits of the integrated circuit device, such as IO circuits 118 that is coupled to the control circuit 104 as shown. The circuits set forth below may be implemented using elements of IO circuits 102 and 116-118 for example. A clocking network 120 is coupled to various elements of the circuit of FIG. 1. The integrated circuit device may also comprise hardened circuits 122. While the circuit of FIG. 1 is provided by way of example, other circuits of implementing an integrated circuit device having IO circuits may be used.

Figure 2:
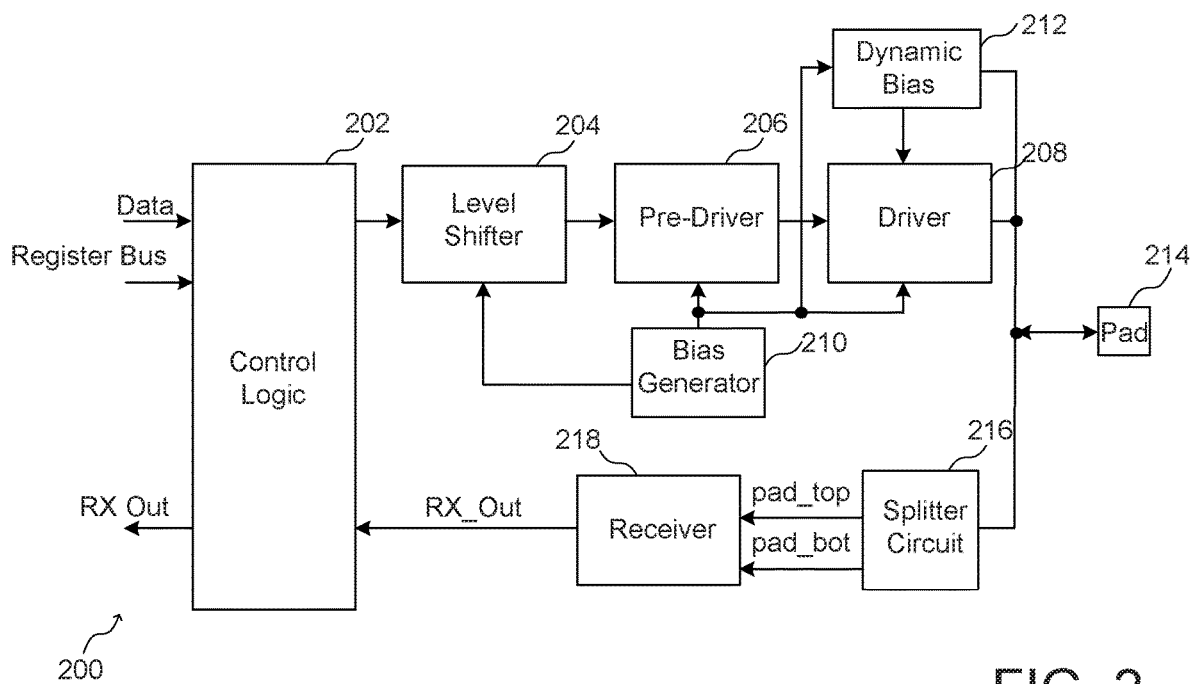
FIG. 2 is a block diagram of a circuit for implementing IO connections, such as in the integrated circuit device of FIG. 1.

Turning now to FIG. 2, a block diagram of a circuit for implementing IO connections, such as in an IO circuit of the integrated circuit device of FIG. 1, is shown. An input/output connection can comprise any elements of an integrated circuit device that enables the transmission or receipt of signals. An IO connection may be implemented in any input/output circuit for example, and may include elements in an IO circuit and other elements of the integrated circuit device. The circuit 200 of FIG. 2 may be implemented in any type of IO circuit, such as a general purpose IO (GPIO) circuit for example, and comprises control logic 202 for receiving inputs for transmitting data. More particularly, the control logic 202 comprises an input for receiving data (Data), and input for receiving information on a register bus, and an output for outputting received data (RXOut). An output of the control logic for transmitting data is coupled to a level shifter 204 which provides the correct voltage level to the data to be transmitted. An output of a level shifter 204 is coupled to a pre-driver 206. The pre-driver 206 is generally a signal conditioner used to provide a signal to a driver 208 that may be adjusted for slew for example. The level shifter 204, pre-driver 206 and driver 208 are coupled to a bias generator 210. The bias generator 210 may provide bias voltages, such as nbias voltage for circuits having n-type transistors and pbias voltages for transistors having p-type transistors, as will be described in more detail below.

A dynamic bias circuit 212 is configured to receive bias signals, such as the nbias and pbias voltages generated by the bias generator 210 for example, and is coupled to an IO contact 214, shown here by way of example as a contact pad. The dynamic bias circuit 212 is also configured to provide dynamic pbias and nbias signals to the driver, as will be described in more detail in reference to FIGS. 5-7. A splitter circuit 216, which functions as a pad splitter circuit, is also coupled to the IO contact 214, where separate signals (e.g. pad_top and pad_bot) based upon an input signal to be received by a receiver 218 are generated. The receiver 218 generates a received signal (RX_Out). An example of a circuit for implementing the pad splitter will be described in more detail below in reference to FIGS. 17-20. While the circuit of FIG. 2 shows an IO contact 214 coupled to both a driver 208 and a receiver 218 (by way of a splitter circuit 216), it should be understood that an IO contact as described in more detail below is not required to be coupled to both a transmitter or a receiver, but could be coupled to only a transmitter or a receiver.

As transistor device lengths continue to decrease (e.g. the gate length of a transistor going from 16 nm to 7 nm), the operation of the transistors continue to change. In 16 nm technology, time dependent dielectric breakdown (TDDB) and hot carrier injection (HCl) limits of both NMOS and PMOS transistors are, by way of example, VDCxy 1.8≤5% when devices are ON, and VTRANxy 1.8≤15% when devices are OFF, where x, y represents terminals of device except bulk, where bulk to any other terminal can tolerate 3.3V. However, in 7 nm technology, reliability limits are much more stringent and limited greatly by HCl because VDCds≤~1.5+10% when devices are ON (limited by HCl), VDCgs≤~1.8+5% when devices are ON (limited by TDDB), and VTRANxy, VDCxy≤~5% when devices are OFF. That is, certain voltage drops in the transistor in 7 nm technology must be approximately 0.3 volts lower. It should be noted that the improvements in technology lowers reliability limits and are also more stringent. The exemplary numbers above related to the operation of transistors are provided by way of example, and can vary from foundry to foundry.

Figure 3:
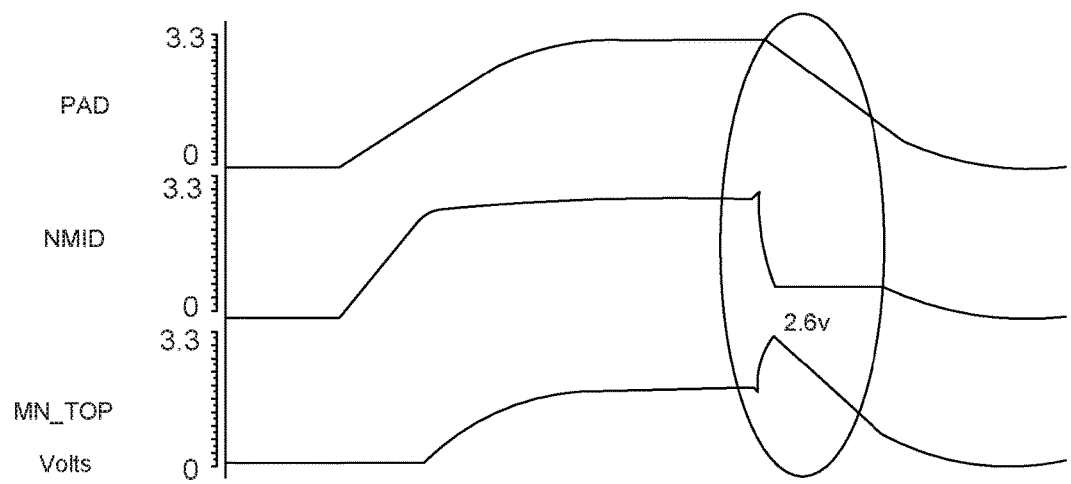
FIG. 3 is a timing waveform showing voltages in an IO circuit that may lead to a degradation of the transistors in the IO circuit.

As can be seen in FIG. 3, a timing waveform shows voltages in an IO circuit that may lead to a degradation of the transistors in the IO circuit. HCl is dominant during transitions in 7 nm technology. For example during the transition of PAD (which represents the voltage on an IO contact element, such as a contact pad of an integrated circuit device) from 3.3V between 0V in a conventional driver (e.g. a pair of p-type transistors in series in a pull-up circuit and a pair of n-type transistors in a pull-down circuit of a conventional driver), Vds of an n-type transistor NM_Top (i.e. the top transistor of the pull-down circuit) and a p-type transistor of a stacked driver experiences higher than tolerable voltage difference momentarily, which may cause an HCl violation and damage to the transistor. As shown in FIG. 3, when PAD (i.e. an IO pad coupled to an output contact) transitions from 3.3V to 0V, the node NMID between a pair of n-type transistors of the pull-down circuit in a conventional output driver may discharge faster than that of the PAD, and may cause a higher Vds and hence a HCl issue for the n-type transistor. Similarly, during the PAD transition from 0V to 3.3V, the p-type transistor of a pull-up circuit (i.e. a pair of pull-up transistors coupled in series) of a conventional output driver may undergo a Vds stress. The circuits and methods provide a dynamic biasing scheme to overcome these risks that may damage transistors in a conventional driver connected to an output pad. The circuits and methods set forth below implement triple stack devices in a driver, as shown for example in FIG. 4, to overcome static and dynamic reliability limits of transistors implemented in a conventional driver arrangement. The circuits and methods also provide a dynamic biasing arrangement, as shown for example in FIG. 7, to overcome problems associated with HCl, as will be described in more detail below.

Figure 4:
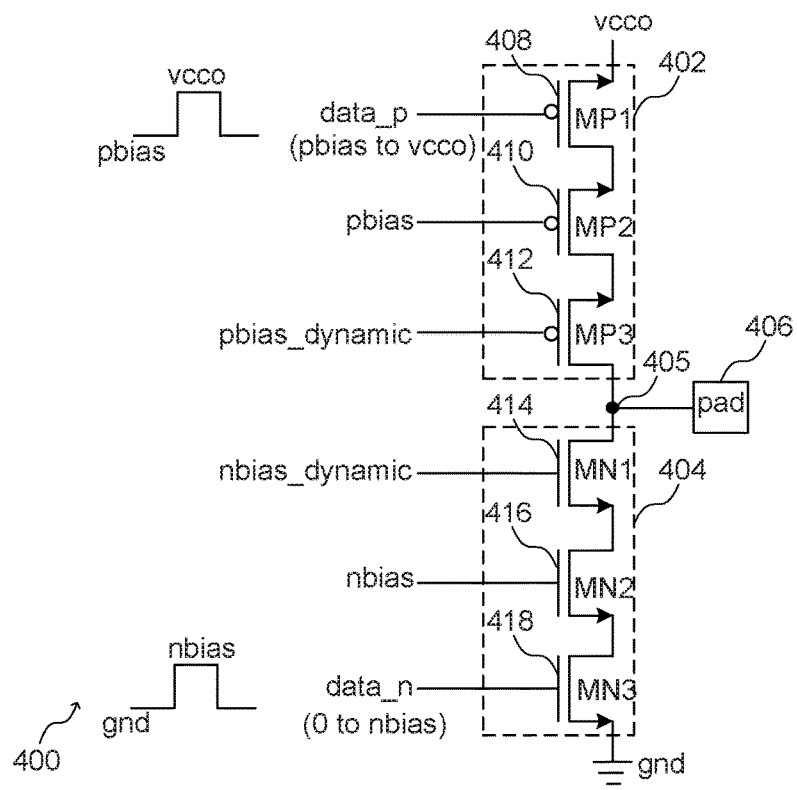
FIG. 4 is a block diagram of a driver circuit for an IO connection of an integrated circuit device.

Turning now to FIG. 4, a block diagram of a driver circuit 400 for an IO connection for an integrated circuit device is shown, where the driver circuit 400 may be implemented as the driver 208 of FIG. 2. The driver circuit 400 comprises a plurality of PMOS transistors and a plurality of NMOS transistors each coupled in series between a reference voltage, shown by way of example here as vcco, and ground. More particularly, the driver circuit 400 comprises a pull-up circuit 402 and a pull-down circuit 404, each may comprise a triple-stack arrangement coupled to each other at an output node 405 that is coupled to at an IO contact 406, shown here as a contact pad. The pull-up circuit 402 comprises 3 PMOS transistors including a first transistor 408 (MP1) configured to receive first input data (data_p) at its gate, a second transistor 410 (MP2) configured to receive a first bias voltage (pbias) at its gate, and a third transistor 412 (MP3) configured to receive a dynamic bias voltage (pbias_dynamic) at its gate. A drain of the transistor 412 is coupled to the IO contact 406. The pull-down circuit 404 comprises 3 NMOS transistors including a fourth transistor 414 (MN1) configured to receive a second dynamic bias voltage (nbias_dynamic) at its gate, a second transistor 416 (MN2) configured to receive a second bias voltage (nbias) at its gate, and a third transistor 418 (MN3) configured to receive a second input data at its gate. A drain of the transistor 414 is coupled to the IO contact 406.

Figure 5:
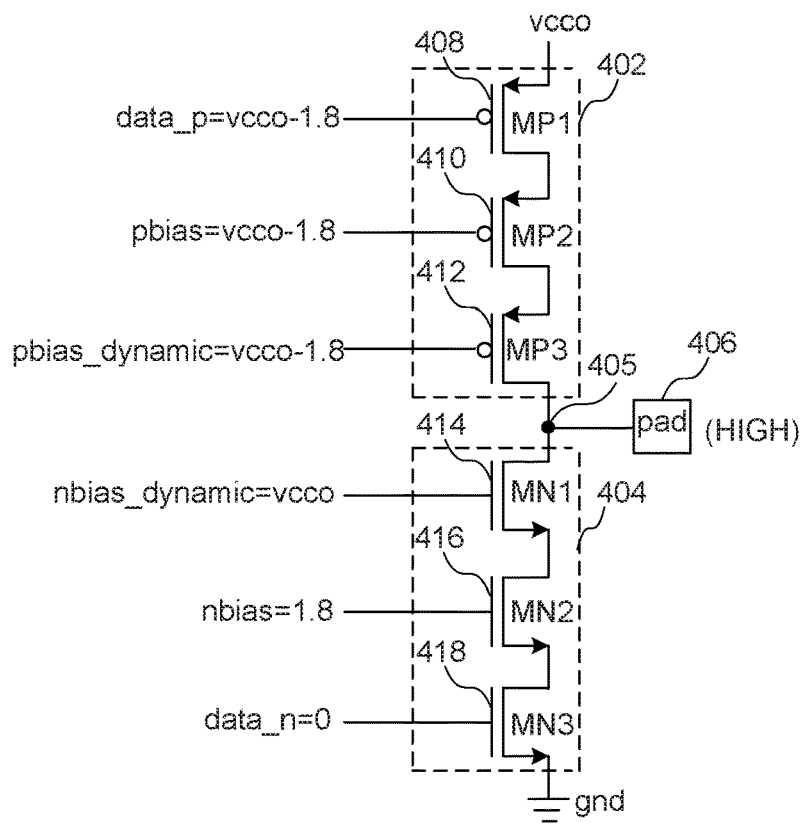
FIG. 5 is a block diagram of a driver circuit for an IO connection of an integrated circuit device with a high pad voltage.
Figure 6:
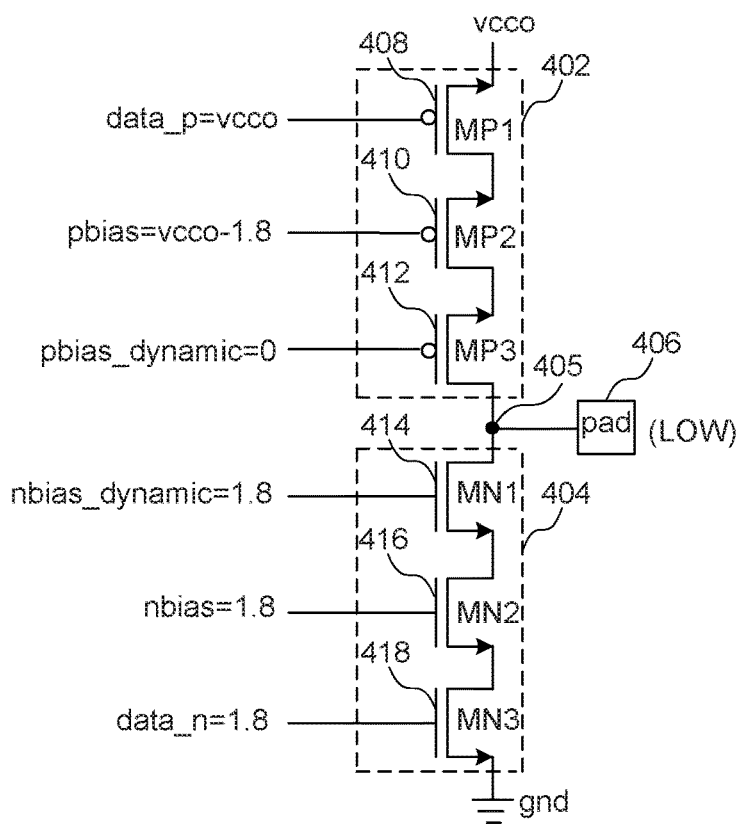
FIG. 6 is a block diagram of a driver circuit for an IO connection of an integrated circuit device with a low pad voltage.

The triple stack driver structure as shown in FIG. 4 along with dynamic biasing arrangement solves the reliability issues discussed above in reference to FIG. 3. While 3 transistors are shown in each of the pull-up and pull-down circuits of FIG. 4, it should be understood more than 3 transistors could be included in the stack. Further, the transistors MP2 and MN2 may be included in the stack to provide an additional threshold voltage drop, which, in addition to generating dynamic biasing signals, provided further voltage protection for the transistors. FIGS. 5 and 6 describes the biasing conditions of each gate. The transistors MP3 and MN1 makes the driver circuit 400 reliable in different signaling conditions and different operating modes. The gate of these two transistors are driven by 2 existing biases which changes dynamically based on a PAD voltage (i.e. a voltage at an IO contact, such as a contact pad for example), as will be described in more detail below.

As shown in FIG. 5, when PAD is high (e.g. vcco), nbias_dynamic=vcco, nbias=1.8V, data_n=0, Vds of MN1=VTHNMOS (i.e. the threshold voltage of an NMOS), Vds of MN2=1.5V (for vcco=3.3V), and Vds of MN3=1.8V−VTHNMOS (i.e. the device is OFF). Thus, it can be observed that, source of MN1 (which is the drain of MN2) is pulled to Vcco-Vth. This arrangement results in a reduced Vds of MN2, unlike in conventional devices having 2 transistors in the pull-down circuit where the Vds voltage across the bias transistor may be higher than 1.8V which cannot be tolerated in 7 nm technology.

In the same way, as shown in FIG. 6, when PAD is low (0V), pbias_dynamic=0, pbias=vcco−1.8V and data_p=vcco, Vds of MP3=|VTHPMOS|, Vds of MP2=1.5V (for vcco=3.3V), and Vds of MP1=1.8V−|VTHPMOS| (i.e. device is OFF). Thus, it can be observed that the source of MP3 (which is drain of MP2) is pulled to Vth. This arrangement results in a reduced Vds of MP2, unlike in a conventional device having 2 transistors in the pull-up circuit, where the Vds voltage of the bias transistor may be higher than 1.8 v which cannot be tolerated in 7 nm technology. Thus, each transistor has more margin for its tolerable voltage limits.

Figure 7:
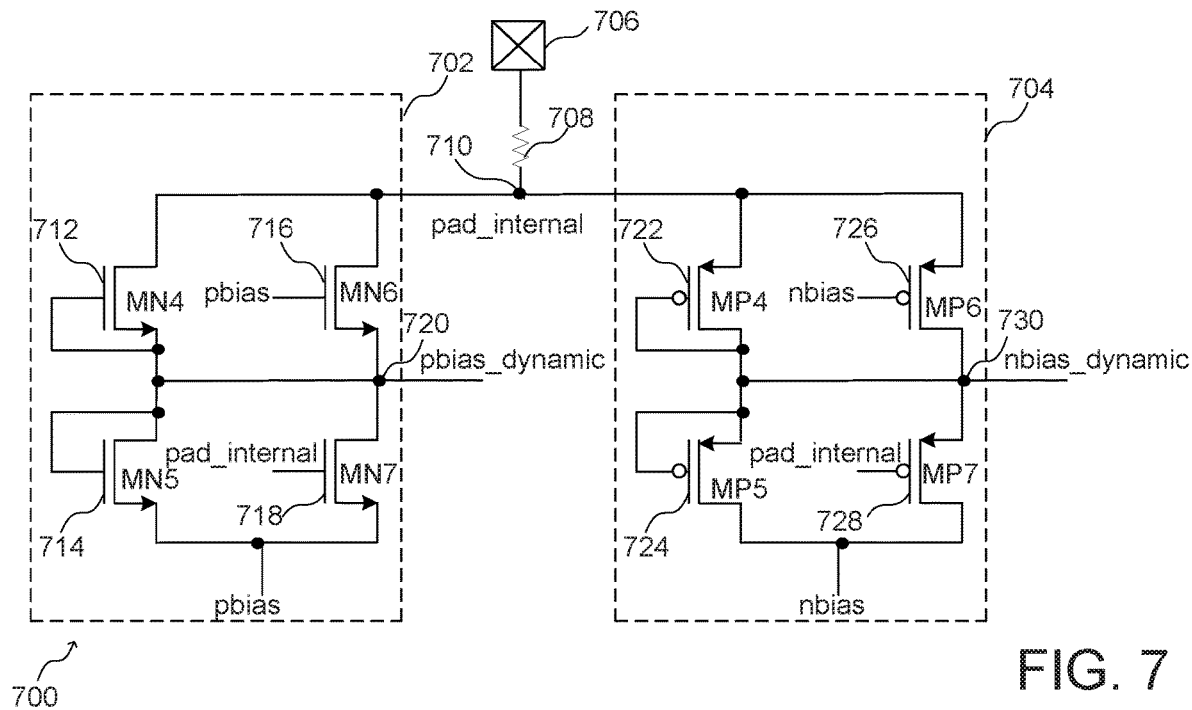
FIG. 7 is a block diagram of a dynamic bias generation circuit for transistors associated with an IO connection of an integrated circuit device.

Turning now to FIG. 7, a block diagram of a bias signal generator 700 for generating dynamic bias signals for transistors associated with an IO driver coupled to an IO connection of an integrated circuit device is shown. The bias signal generator 700 may be implemented as the dynamic bias circuit 212 of FIG. 2 for example. The circuit of FIG. 7 comprises a first dynamic bias signal generator circuit 702 for generating a first dynamic bias signal (pbias_dynamic) for p-type transistors, and a second dynamic bias signal generator circuit 704 for generating a second dynamic bias signal (nbias_dynamic) for n-type transistors. The dynamic bias signals vary based upon the voltage at the contact pad, and more particularly an internal pad voltage as will be described in more detail below. Each of the dynamic bias signal generator circuits 702 and 704 are coupled to the IO contact 706 (shown here as contact pad that enables and IO connection) by a resistive element 708 at a node 710, where an internal IO contact voltage (pad_internal) signal is a signal associated with the IO contact 706 and is generated at the node 710 based upon the resistive element 708. The resistive element 708 is provided to comply with electrostatic discharge (ESD) requirements. As will be described in more detail below in reference to FIG. 13, the resistive element can be replaced with a circuit for generating the internal IO contact voltage that provides protection from voltage overshoot and undershoot at the node 710.

The first dynamic bias signal generator circuit 702 comprises a pair of stacked transistors coupled between the node 710 and a corresponding node that receives a bias signal (e.g. pbias), including a first pair of transistors 712 and 714 and a second pair of transistors 716 and 718 coupled between the node 710 and a node receiving the pbias signal. A dynamic bias voltage (pbias_dynamic) is generated at a node 720. The second dynamic bias signal generator circuit 704 comprises a pair of stacked transistors coupled between the node 710 and a correspond node to receive a bias signal (i.e. nbias), including a first pair of transistors 722 and 724 and a second pair of transistors 726 and 728 coupled between the node 710 and a node receiving the nbias signal. A dynamic bias voltage (nbias_dynamic) is generated at a node 730. The pbias_dynamic and the nbias_dynamic signals will vary based upon the internal pad voltage (i.e. the voltage generated at the node 710).

Figure 8:
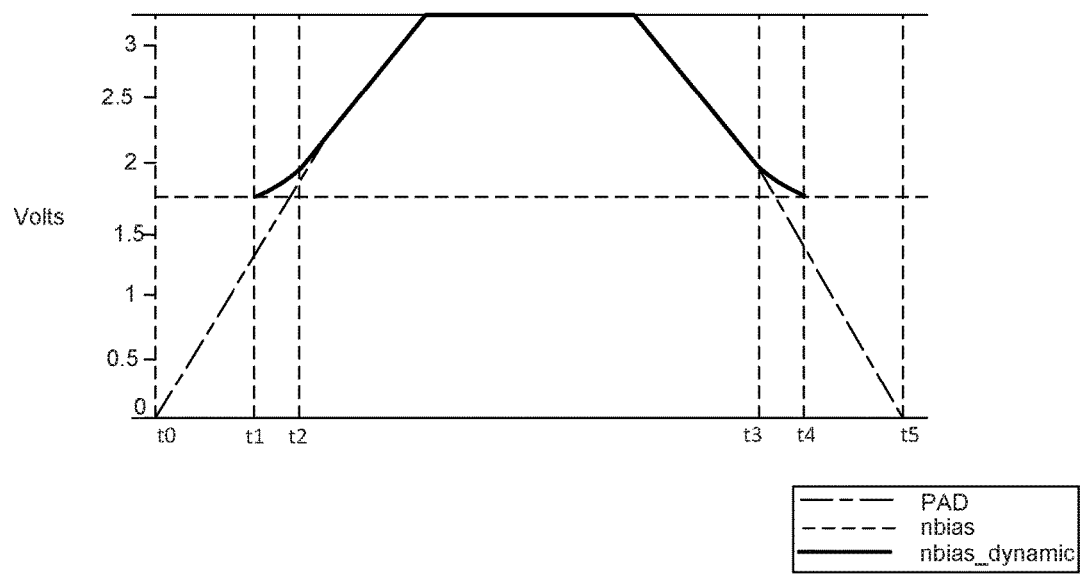
FIG. 8 is a timing waveform showing a generation of a dynamic nbias signal.
Figure 9:
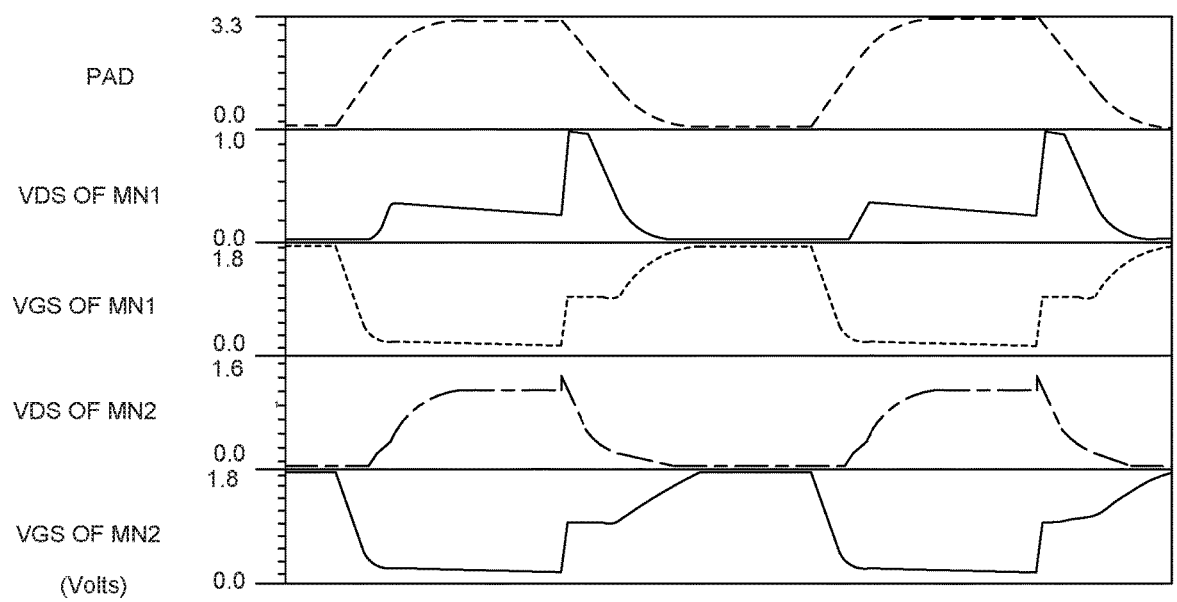
FIG. 9 is a timing waveform showing a voltage switching of NMOS devices in the driver of FIG. 4.

Turning now to FIG. 8, a timing waveform shows a generation of a dynamic nbias signal (nbias_dynamic) using the circuit of FIG. 7. From times t0 to t1, the PAD (i.e. the voltage at the IO contact 706) is less than nbias. Transistor MP6 is off and MP7 will be on, and therefore nbias_dynamic will be equal to nbias. From t1 to t2, PAD and nbias are close to each other. The transistors MP4 and MP5 will tightly keep nbias_dynamic in the range "nbias-Vth" to "nbias+vth". During the period from t2 to t3, MP7 will be completely off as PAD is higher than nbias. MP6 will be fully on making nbias_dynamic follow PAD. From t3 to t4, as PAD approaches nbias, nbias_dynamic will be close to nbias. From t4 to t5, as PAD transitions to voltage lesser than nbias, transistor MP7 will be on and MP6 is off, in effect nbias_dynamic will be clamped to nbias. Thus, nbias_dynamic will always be higher than or equal to nbias. This ensures all the NMOS transistors MN1, MN2 and MN3 in the driver stack will have vgs and vds within reliable voltage limits. FIG. 9 shows the vds of NMOS transistors in driver stack. It can be observed that neither transistor has Vds of more than 1.6V.

Figure 10:
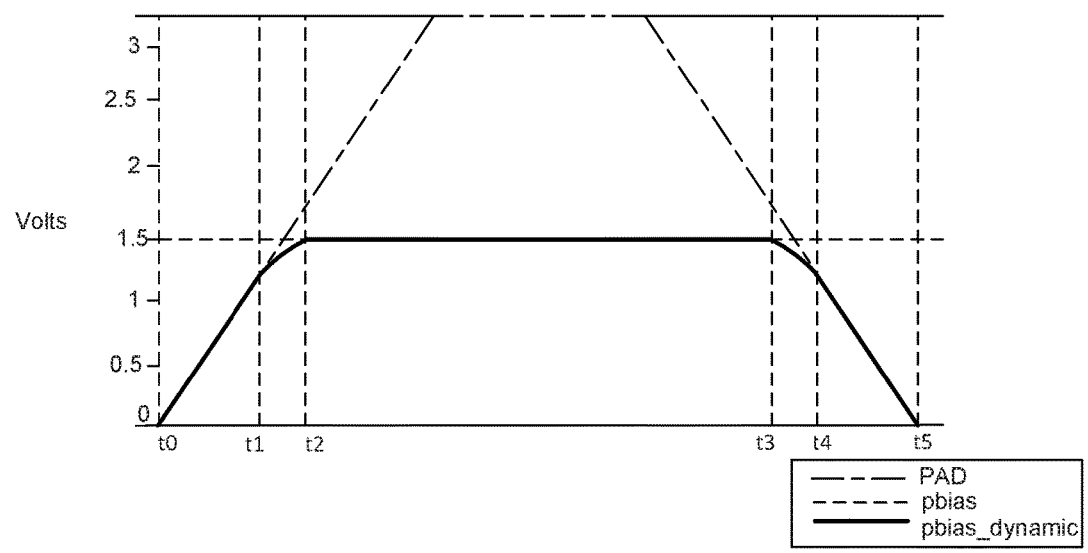
FIG. 10 is a timing waveform showing a generation of a dynamic pbias signal.
Figure 11:
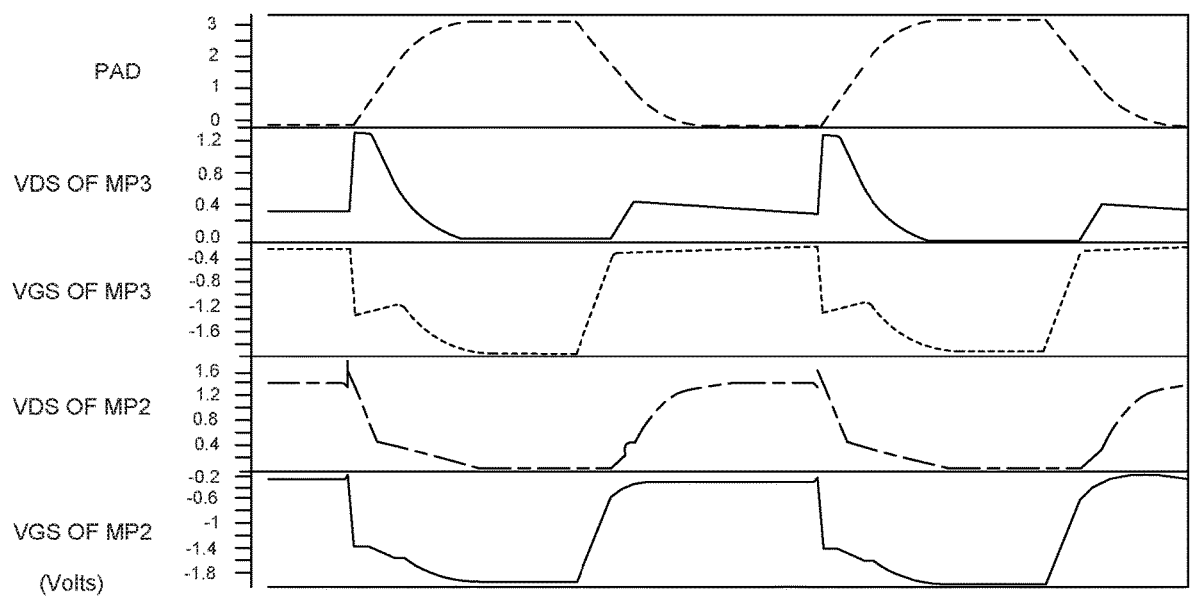
FIG. 11 is a timing waveform showing a voltage switching of PMOS devices in the driver of FIG. 4.

Turning now to FIG. 10, a timing waveform shows a generation of a dynamic pbias signal using the circuit of FIG. 7. From time t0 to t1, PAD is less than pbias, and pbias_dynamic will follow PAD as transistors MN7 is off and MN6 is on. From t1 to t2, PAD and pbias are close to each other, transistors MN4 and MN6 will tightly keep pbias_dynamic in the range "pbias-Vth" to "pbias+vth". During the period from t2 to t3, PAD is higher than pbias, so transistor MN7 is on and MN6 will be off making pbias_dynamic equal to pbias. From t3 to t4, as PAD approaches pbias, pbias_dynamic will be close to pbias. From t4 to t5, as PAD is lesser than pbias, MN7 is off and MN6 completely turns on to make pbias_dynamic follow PAD. Thus, pbias_dynamic will always be lesser than or equal to pbias. This ensures that the PMOS transistors MP1, MP2 and MP3 in the driver stack will have vgs and vds with in reliable voltage limits. FIG. 11 shows the vds of the PMOS transistors in driver stack, where it can be observed that neither transistor has Vds of more than 1.6V.

Figure 12:
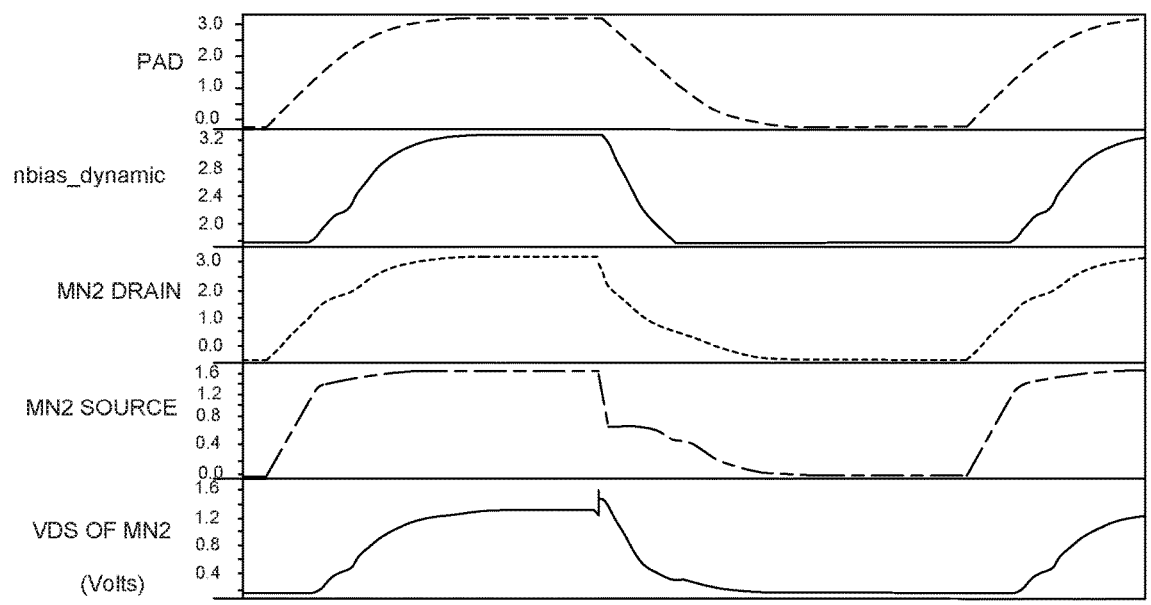
FIG. 12 is a timing waveform showing source and drain voltages of an NMOS transistor when the pad is switching.

Turning now to FIG. 12, a timing waveform shows drain and source voltage waveforms during the switching of signals on a pad. In a TX mode using the driver as shown in FIG. 4, during high to low transition of PAD as shown in FIG. 12, source of MN2 will start falling faster initially than the PAD, but as PAD lowers, MN1 gate (nbias_dynamic) will follow PAD and which eventually reduces the drain voltage of MN2. Hence the Vds of MN2 will be within the limits of reliability stress. Similarly, during low to high transition of PAD, source of MP2 will start rising faster initially than the PAD, but as PAD changes MP3 gate will also rise and which eventually reduces drain of MP2. Hence the Vds of MP2 will be well within the limits of reliability stress. In the same way, the triple stack structure of FIG. 4 can tolerate higher overshoot/undershoot conditions on PAD. For example, during overshoot of vcco+0.3 volts at PAD, gate of MN1 will be pulled to vcco+0.3 volts and source will be at vcco+0.3–Vth volts. Therefore, the full overvoltage stress will not be across MN2. The third transistor MN1 of the stack helps in protecting Vds of MN2 by up to Vth volts. In the same way undershoot can go easily as low as −0.3 v. The third transistor MP3 of the stack will help in protecting Vds of MP2 by up to Vth volts. Higher overshoot and undershoot protection still can be supported for reduced time intervals.

Figure 13:
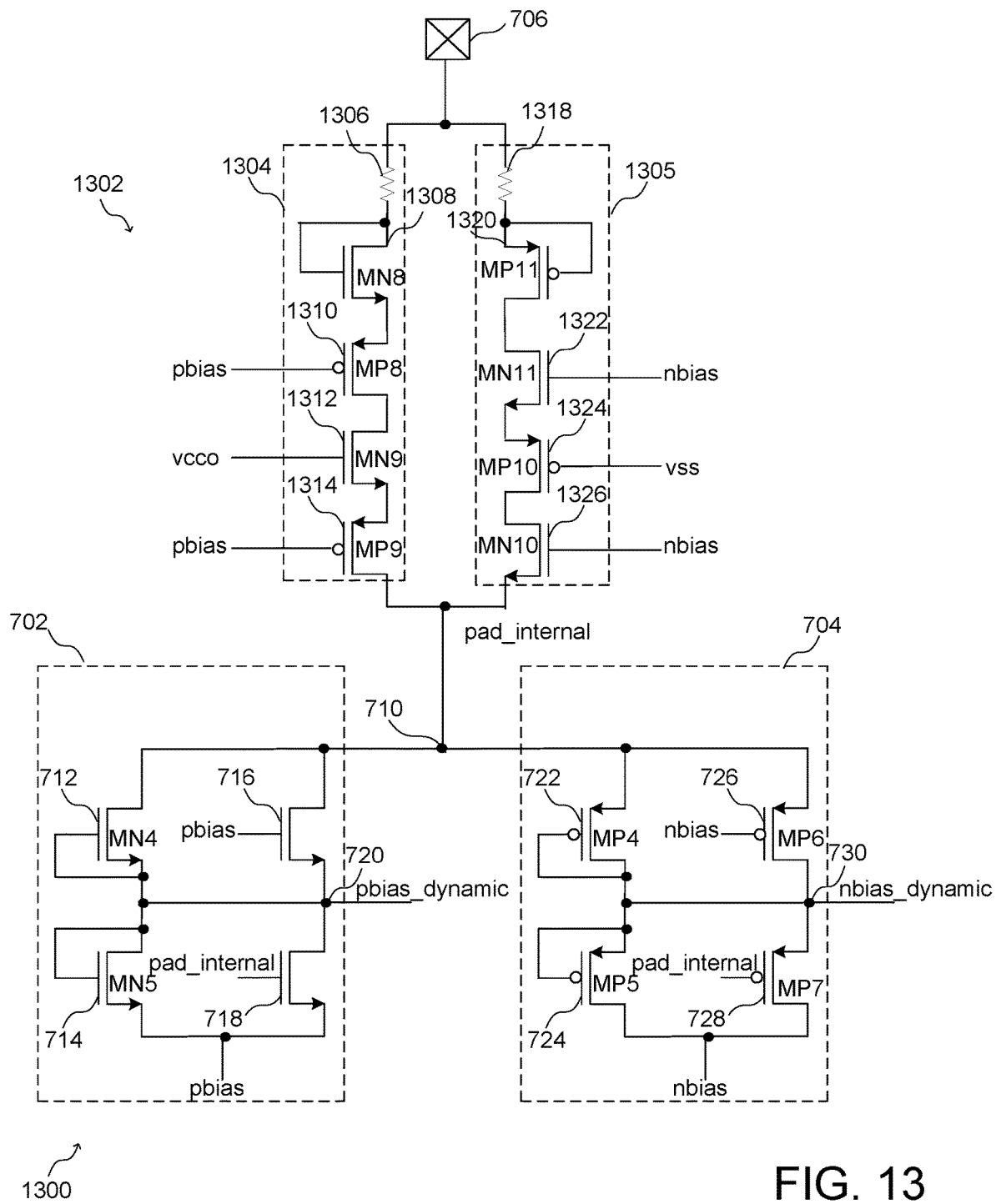
FIG. 13 is a block diagram of a dynamic bias generation circuit including overshoot and undershoot protection for transistors associated with an IO connection of an integrated circuit device.

Turning now to FIG. 13, a block diagram of a dynamic bias generation circuit for transistors associated with in IO connection of an integrated circuit device according to another implementation is shown. The dynamic bias generation circuit 1300 includes and an internal voltage signal generator 1302 coupled to the node 710, and may also be implemented as the dynamic bias circuit 210 of FIG. 2. According to the implementation of FIG. 13, the internal voltage signal generator 1302, which provides additional protection for overshoot and undershoot voltages, comprises a first series of transistors 1304 for receiving the pbias voltage and a second series of transistors 1305 receiving the n-bias voltage. The first series of transistors 1304 is coupled to a resistor 1306 and comprises a first transistor 1308 comprising an n-type transistor having its gate coupled to its drain. The first series of transistors also includes a second transistor 1310 comprising a p-type transistor configured to receive the pbias signal at its gate, a third transistor 1312 configured to receive a reference voltage, shown here as vcco, at its gate, and a fourth transistor 1314 configured to receive the pbias voltage at its gate. The drains of the transistors 1310 and 1312 are coupled together, and the drain of the transistor 1314 is coupled to the node 710.

The second series of transistors 1305 is coupled to a resistor 1318 and comprises a fifth transistor 1320 comprising an p-type transistor having its gate coupled to its source. The second series of transistors also includes a sixth transistor 1322 comprising a n-type transistor configured to receive the nbias signal at its gate, a seventh transistor 1324 configured to receive a second reference voltage, shown here as vss (i.e. ground), at its gate, and an eighth transistor 1326 configured to receive the pbias voltage at its gate. The sources of the transistors 1322 and 1324 are coupled together, and the source of the transistor 1326 is coupled to the node 710. The resistors 1306 and 1318 are selected for the device to meet ESD rules, and could be approximately 300 Ohms for example.

The use of dynamic bias generators as described in the circuits of FIGS. 4 and 13 improve the performance of a driver compared to conventional devices, and more particularly, improves reliability by preventing damage to transistor and is independent of loading at PAD. Since the feedback path has only 2 devices receiving the pad internal voltage, latency is low and therefore supports faster transitions at PAD. As a result, it is not necessary to include a Schmitt based sensing circuit and the driver circuit can support higher frequency. The circuits also supports termination at PAD. Further, since feedback is a function of a PAD voltage and is independent of data, the IO circuit works well even in receive mode of operation. Because the circuit provides a data independent feedback arrangement, resulting in reduced latency of the transmit path compared to conventional devices. The driver circuit is also independent of loading conditions of PAD, and therefore is beneficial in a wide variety of use cases.

Figure 14:
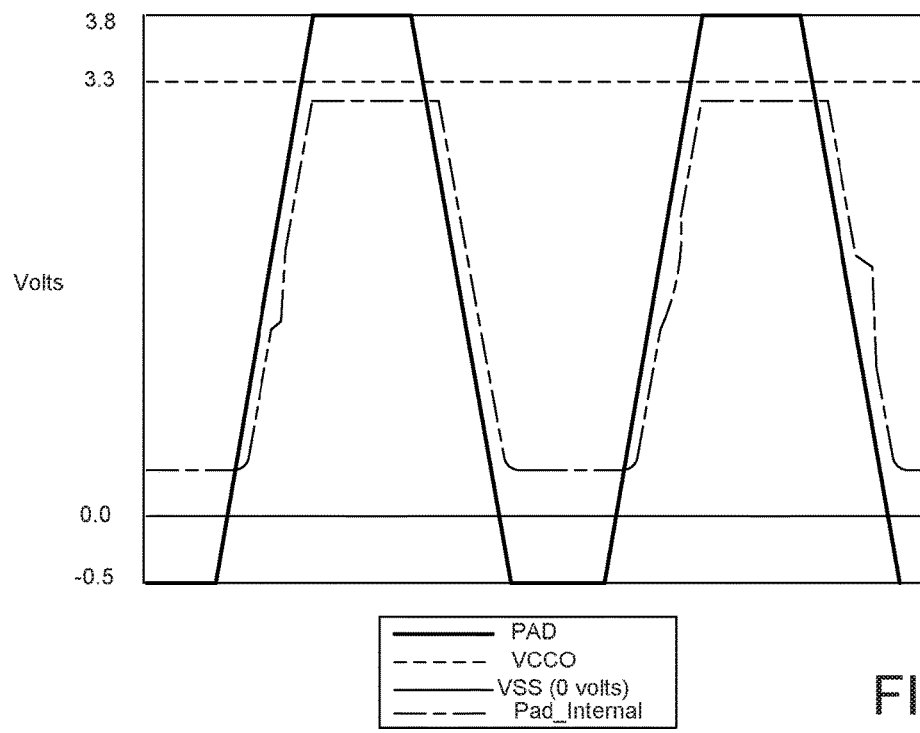
FIG. 14 is a timing waveform showing an internal pad voltage when the pad is switching.

Also, by implementing the overshoot/undershoot protection using the internal voltage signal generator 1302 of FIG. 13, the driver having a triple structure transistor arrangement is more robust for overshoots and undershoots, and provides higher tolerance towards overshoot and undershoot voltages on the PAD. Transistors MN8, MP8, MN9 and MP9 ensure that when PAD is high, the pad_internal maximum voltage will be vcco−Vthn where Vthn is threshold voltage of NMOS. Similarly, when PAD is low, transistors MN10, MP10, MN11 and MP11 maintains the minimum value of pad_internal close to threshold voltage Vthp of PMOS, where Vthp is threshold voltage of PMOS. Thus, even when the PAD switches from −v_os to vcco+v_os, where v_os represents a voltage higher than Vcco or lower than ground, pad_internal will only swing from vthp to vcco−vthn. FIG. 14 clearly represents a scenario where PAD is switching from −0.5 v to vcco+0.5 v and pad_internal is swinging from vthp to vcco−vthn.

Figure 15:
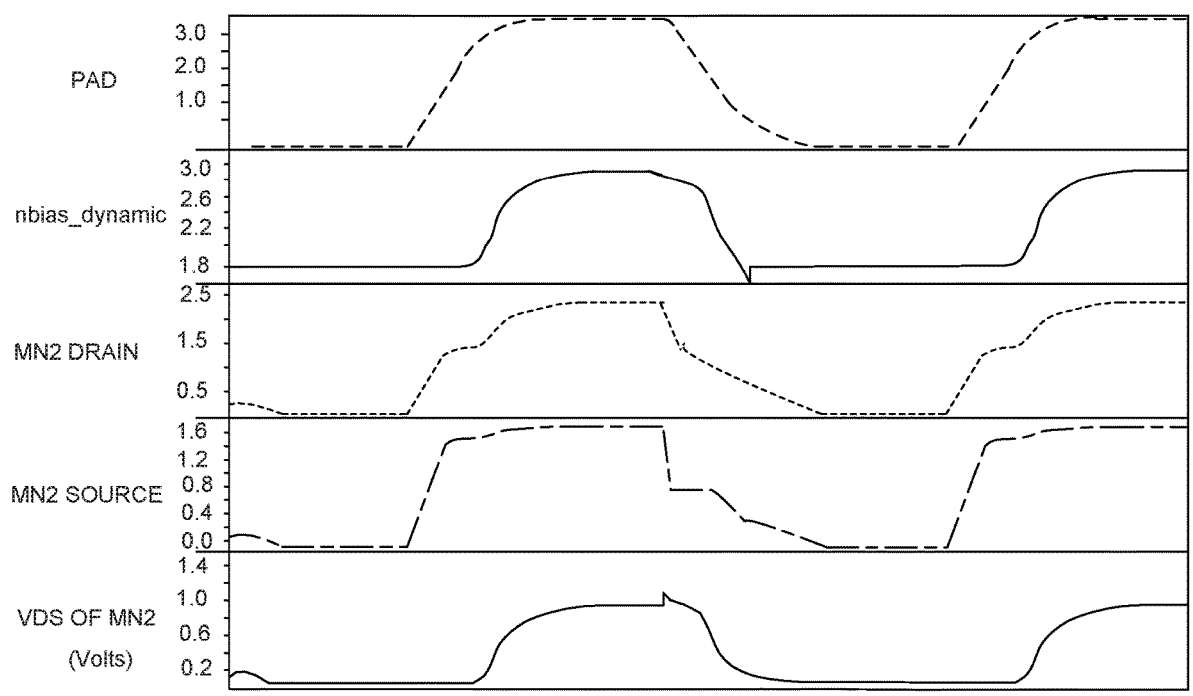
FIG. 15 is a timing waveform showing the nbias dynamic drain and source of an NMOS transistor while the pad is switching.

More particularly, because both nbias_dynamic and pbias_dynamic are derived from pad_internal voltage, the maximum values of nbias_dynamic will be vcco-vthn and the minimum value of pbias_dynamic will be vthp. With reference to FIG. 4, when PAD is high (i.e. vcco+v_os), the nbias_dynamic=vcco−Vthn, nbias=1.8V, and data_n=0. The voltage at the source of MN1/Drain of MN2 will be vcco−2*Vthn. Hence, Vds of MN1=v_os+2*Vthn. Vds of MN2=1.5V−Vthn (For vcco=3.3V) and Vds of MN3=1.8V−Vthn (i.e. the device is OFF). Thus, it can be observed that in FIG. 15 that Vds of MN2 has higher Vds tolerance now compared with conventional devices, and additional margins introduced can be as high as Vthn of an NMOS device.

By using different nbias and pbias values the triple stack driver of FIG. 4 along with dynamic bias generator circuit of FIG. 13, IO applications of 3.3 supply voltage can be used with 1.5 v tolerable transistors as shown below. As shown in FIG. 4, when PAD is high(vcco), nbias_dynamic=Vcco-Vthn, nbias=1.5V and data_n=0; Vds of MN1=2VTHNMOS=0.8 v (for VTHNMOS=0.4); Vds of MN2=Vcco-Vthn-1.5V=1.4 v (for vcco=3.3V) and Vds of MN3=1.5V−VTHNMOS (Device is OFF). Thus, it can be observed that, source of MN1 which is drain of MN2 is pulled to Vcco−2*Vthn. This has reduced Vds of MN2. In the same way, when PAD is low (0V), pbias_dynamic=VTHPMOS, pbias=vcco-1.5V and data_p=vcco; Vds of MP3=2*|VTHPMOS|=0.8V (For VTHPMOS=0.4); Vds of MP2=Vcco−|VTHPMOS|−1.5V=1.4V (for vcco=3.3V); and Vds of MP1=1.5V−|VTHPMOS| (Device is OFF). Thus, it can be observed that the source of MP3, which is drain of MP2, is pulled to 2*Vth, resulting in a reduced Vds of MP2. Thus, each transistor has more margin for its tolerable voltage limits and can be used to support reliability for future generations circuits having different transistor dimensions.

Figure 16:
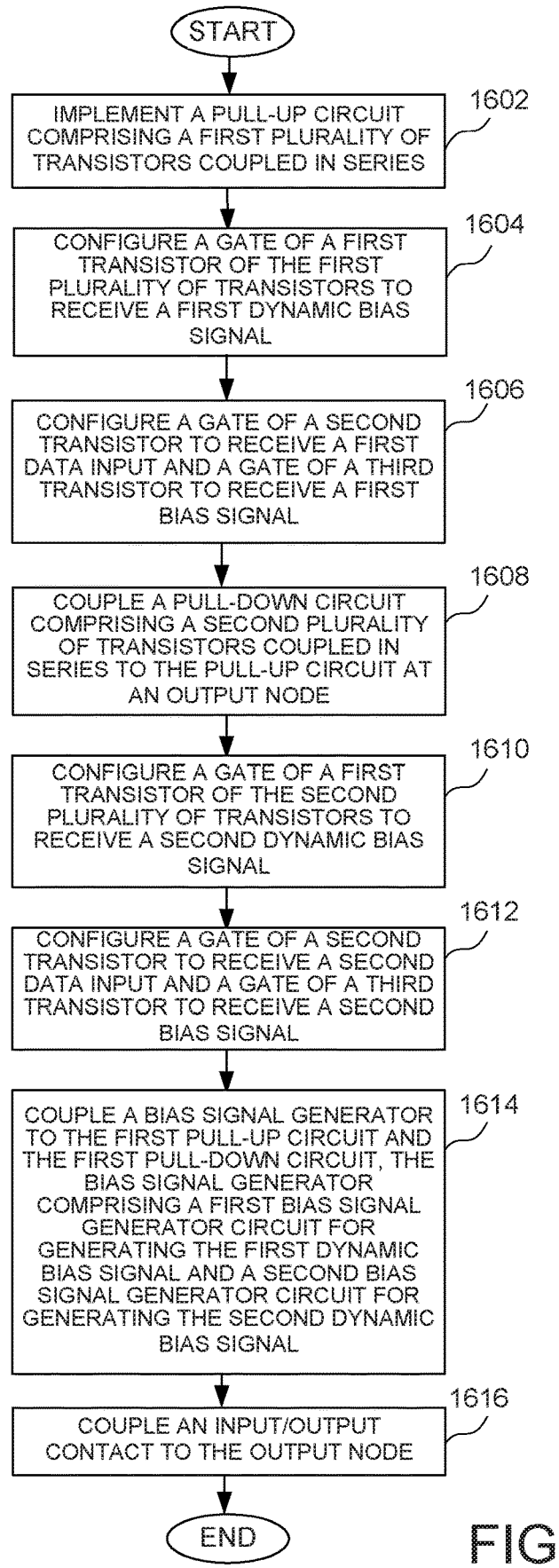
FIG. 16 is a flow chart showing a method of implementing IO connections in an integrated circuit device.

Turning now to FIG. 16, a flow chart shows a method of implementing IO connections in an integrated circuit device. More particularly, a pull-up circuit, such as pull-up circuit 402, comprising a first plurality of transistors coupled in series is implemented at a block 1602. A gate of a first transistor of the first plurality of transistors is configured to receive a first dynamic bias signal at a block 1604. A gate of a second transistor of the first plurality of transistors may be configured to receive a first data input and a gate of a third transistor may be configured to receive a first bias signal at a block 1606. A pull-down circuit, such as pull-down circuit 404, comprising a second plurality of transistors coupled in series is coupled to the pull-up circuit at an output node at a block 1608. A gate of a first transistor of the second plurality of transistors is configured to receive a second dynamic bias signal at a block 1610. A gate of a second transistor of the second plurality of transistors is configured to receive a second data input and a gate of a third transistor may be configured to receive a second bias signal at a block 1612. A bias signal generator may be coupled to the first pull-up circuit and the first pull-down circuit, the bias signal generator comprising a first bias signal generator circuit for generating the first dynamic bias signal and a second bias signal generator circuit for generating the second dynamic bias signal at a block 1614. An input/output contact, such as IO contact 406, is coupled to the output node at a block 1616.

According to some implementations, the first bias signal generator circuit comprises a first series of transistors coupled between the output node and a node receiving a first bias signal, wherein a first transistor of the first series of transistors has a gate configured to receive the first bias signal and the second transistor of the series of transistors has a gate configured to receive a signal associated with the input/output contact. Also, the second bias signal generator circuit may comprise a second series of transistors coupled between the output node and a node receiving a second bias signal, wherein a first transistor of the second series of transistors has a gate configured to receive the second bias signal and the second transistor of the series of transistors has a gate configured to receive the signal associated with the input/output contact.

The method may further comprise coupling an internal input/output signal generator circuit between the output node and the input output contact, wherein the input/output signal generator circuit comprises a first series of transistors including a first transistor having a gate configured to receive a first bias signal, and a second series of transistor including a first transistor having a gate configured to receive a second bias signal.

The method of FIG. 16 may be implemented using the circuits of FIGS. 1-15 as described, and particularly the triple stack driver of FIG. 4 and the bias generator of FIG. 7 or FIG. 13, or using some other suitable circuits. While specific elements of the method are described, it should be understood that additional elements of the method, or additional details related to the elements, could be implemented according to the disclosure of FIGS. 1-15.

Figure 17:
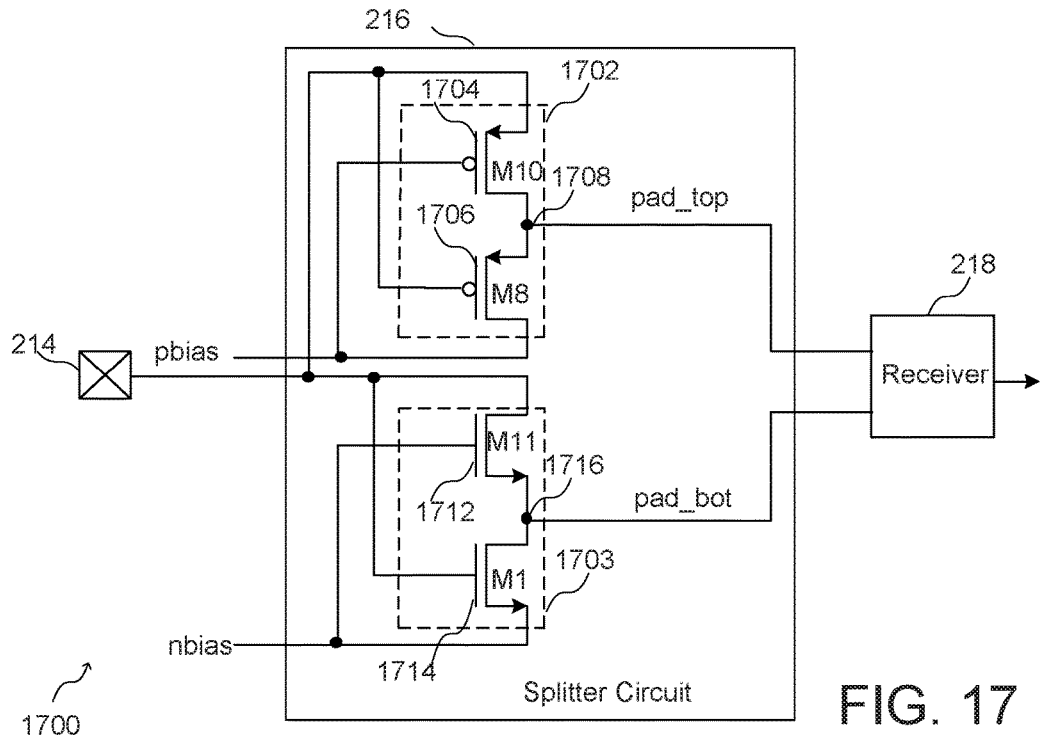
FIG. 17 is a block diagram of a receiver arrangement having a pad splitter circuit.

Turning now to FIG. 17, a block diagram of a portion of an IO circuit 1700 having a splitter circuit, is shown. The IO circuit 1700 comprises a splitter circuit 1701, which can be implemented as the splitter circuit 216, which comprises a top pad signal generator 1702 to generate a first signal (pad_top) associated with a voltage on an input/output contact (e.g. a contact pad) and a bottom pad signal generator 1703 to generate a second signal (pad_bot) associated with the voltage on the input/output contact. The top pad signal generator 1702 comprises a first p-type transistor 1704 having a source coupled to the IO contact 214 and a gate coupled to the drain of the transistor 1706. The gate of the transistor 1706 is coupled to the source of the transistor 1704, and the drain of the transistor 1704 is coupled to the source of the transistor 1706 at a node 1708 which generates the pad_top signal at the input of the receiver 218.

The bottom pad signal generator 1703 comprises a first n-type transistor 1712 having a drain coupled to the IO contact 214 and a gate coupled to the source of the transistor 1714. The gate of the transistor 1714 is coupled to the drain of the transistor 1712, and the source of the transistor 1712 is coupled to the drain of the transistor 1714 at a node 1716 which generates the pad_bot signal at the input of the receiver 218. The pad splitter is implemented to ensure that the signal on the IO contact 214 (i.e. the PAD signal) is split into two input signals in such a way that each split signal has swing limit that is within a tolerable value (i.e. values where voltage drops across the transistor do not exceed a value which causes damage to the transistor) and at the same time to retain characteristics of input signal (e.g. input slew).

Figure 18:
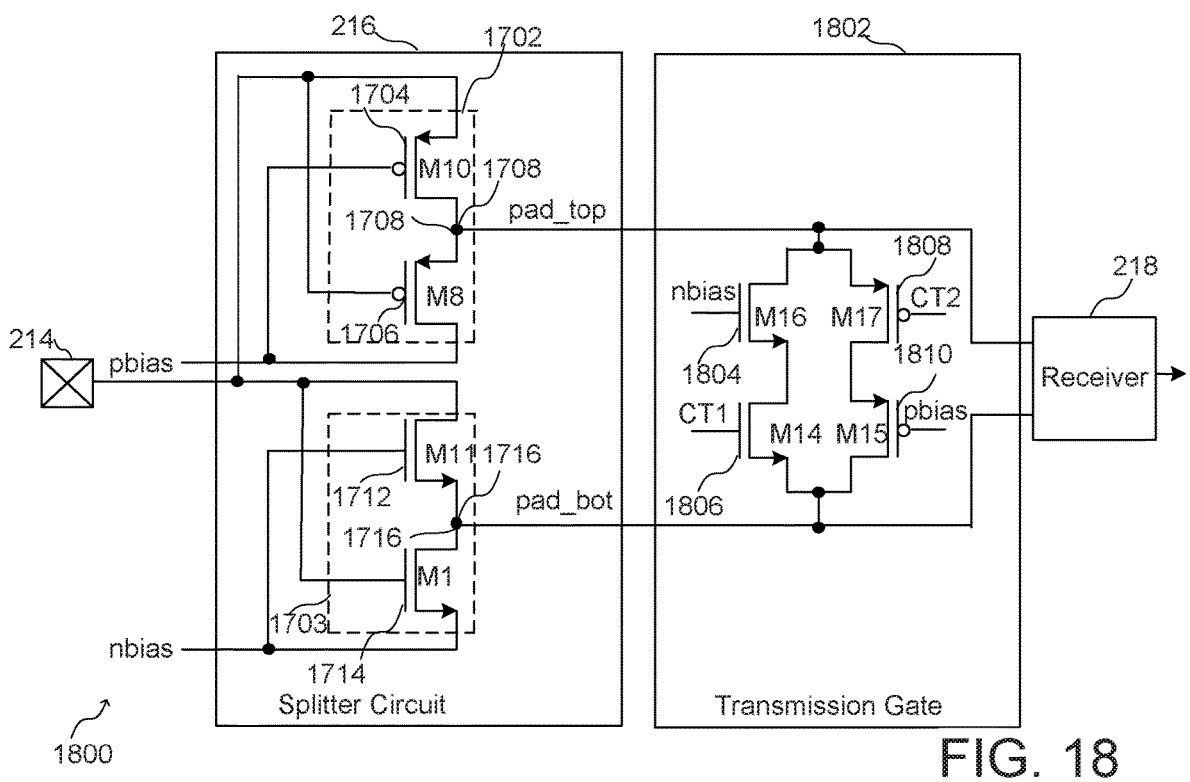
FIG. 18 is a block diagram of a receiver arrangement having a pad splitter circuit and a transmission gate.

Turning now to FIG. 18, a block diagram of a portion of an IO circuit 1800 having a splitter circuit and a transmission gate is shown. In addition to the splitter circuit 1701, the portion of the IO circuit 1800 comprises a transmission gate 1802. More particularly, the transmission gate 1802 comprises a pair of series connected transistors that are coupled between the nodes 1708 and 1716 of the splitter circuit. More particularly, a first series of n-type transistors comprises a first transistor 1804 configured to receive a nbias signal at its gate and a second transistor 1806 configured to receive a first control signal (CT1) at its gate. A first series of p-type transistors comprises a third transistor 1808 configured to receive a second control signal (CT2) at its gate and a fourth transistor 1810 configured to receive the pbias signal at its gate. The first control signal CT1 and the second control signal CT2 comprise enable signals that enable shorting the outputs of the top pad signal generator 1702 and the bottom pad signal generator 1703. The first control signal may be an inverted version of the second control signal.

According to some implementations, the transmission gate 1802 is used to short the pad_top signal and the pad_bot signal during 1.2V, 1.5V and 1.8V (low voltage (LV) modes) modes of operation such that pad_top and pad_bot, both, achieve full swing (0 to VCCO). The enable signals may be implemented as shown in the following Table 1 for high voltage (HV) and LV modes.

TABLE 1

Bias Conditions of a Splitter Circuit

| Voltage condition/signals | en1p8_vcco (CT1) | en1p8_b_vcco (CT2) | pbias | nbias |
| --- | --- | --- | --- | --- |
| VCCO > 1.8 V (2.5 V & 3.3 V) (HV Mode) | 0 | vcco | vcco-1.8 | 1.8 (Bias) |
| VCCO <= 1.8 V (1.8 V, 1.5 V & 1.2 V) (LV Mode) | vcco | 0 | 0 | vcco |

It should be noted that a voltage detector could be used for example to determine whether vcco is greater than or less than 1.8 volts in order to determine whether to operate in an HV mode or an LV mode. Further, the transmission gate 1802 is optionally included, where the receiver may operate properly without it, but is implemented if necessary to short the pad_top and pad_bot signals. A waveform showing the generation of the top pad signal and the bottom pad signal is provided by example in FIG. 19.

Figure 19:
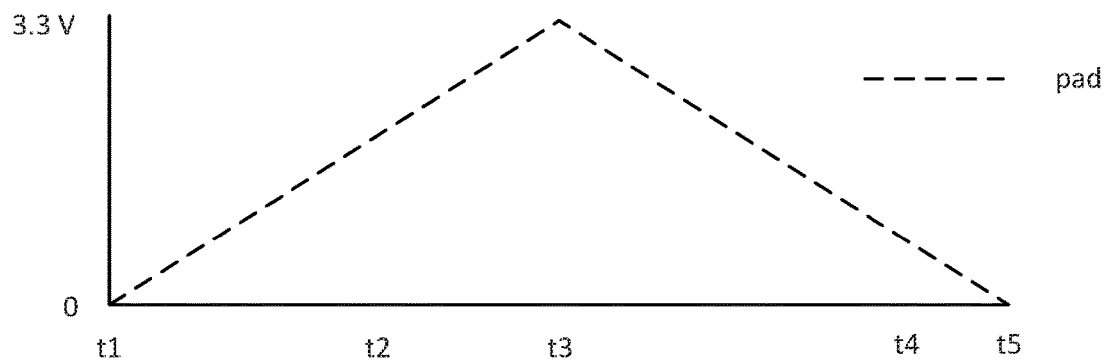
FIG. 19 are timing waveforms showing input and output signals associated with the pad splitter circuit.
Figure 19:
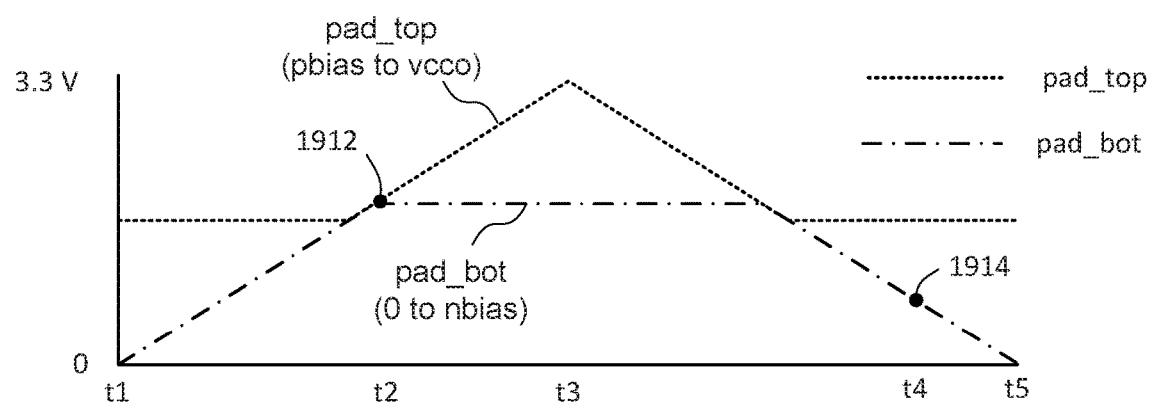
Figure 19:
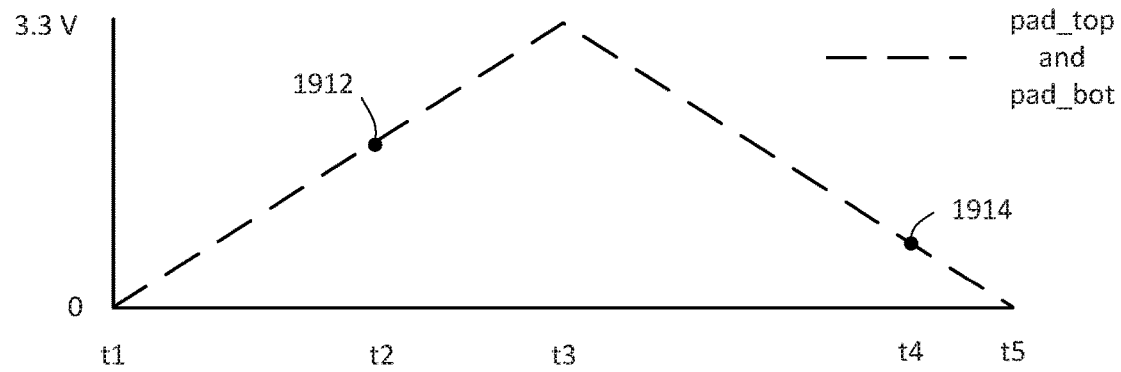

Turning now to FIG. 19, a timing waveform shows input and output signals associated with the splitter circuit. The input to receiver indicated as PAD in the top timing waveform is as shown in FIG. 19 and corresponding bias conditions are described in Table 1. Considering timeframe from t1 to t3 in FIG. 19, when PAD is 0, M8 is ON and M10 is OFF. Therefore, pad_top gets clipped at pbias. As the PAD voltage rises towards vcco until t2, pad_top stays at pbias. When PAD voltage crosses t2, M8 is OFF completely and M10 is ON completely. Pad_top starts following PAD until t3. It can also be observed that, the voltage difference between any two terminals of a device in entire range does not cross its reliability limits. In such a setup, voltage drops across terminals of M8 and M10–Vgs, Vgd— are always less than 1.8V and vds of ON devices less than 1.5 v which maintains the reliability of the circuit. From timeframe t3 to t5 in FIG. 19. At T3, when PAD is at vcco, M10 is ON and M8 is OFF. Pad_top follows PAD. As PAD voltage drops less than pbias (such as at t4), M10 slowly turns off and M8 slowly turns ON. When PAD<pbias–vtp, pad_top clips to pbias until T5.

In bottom pad signal generator 1703 of FIG. 17, the circuit uses PAD and nbias to generate the bottom pad signal (pad_bot). Considering the timeframe from t1 to t3 in FIG. 19, when PAD is 0, M11 is ON and M1 is OFF at time t1. Therefore, the bottom pad signal (pad_bot) follows PAD and becomes 0. As the PAD voltage rises towards vcco, M11 slowly turns off and M1 slowly turns ON. When PAD voltage crosses for example 1.5 volts at a trigger point 1912 at t2, M11 is OFF completely and M1 is ON completely. Pad_bot reaches the nbias voltage level and clips to nbias until T3.

Considering the timeframe t3 to t5 in FIG. 19. At t3, when PAD is at vcco, M1 is ON and M11 is OFF, and pad_bot is nbias at time t2. As PAD voltage drops less than nbias (such as a switching point 1914 at T4), M1 slowly turns off and M11 slowly turns ON. When PAD is the than nbias–vtn, pad_bot again starts following PAD until t5. It can also be observed that, the voltage difference between any two terminals of a device in entire range does not cross its reliability limits (i.e. has a voltage that may cause damage to transistors of the integrated circuit device). For example, voltage drops (e.g. Vgs, Vgd) across terminals of M1 and M11 are always less than 1.8V, and the vds of ON devices is less than 1.5V which prevents damage to the transistors and maintains the reliability of the circuit. Thus mathematically, pad_top=Max (pbias, PAD), and pad_bot=Min (nbias, PAD). Hence, the pad_top voltage swings from pbias to vcco and pad_bot voltage swings from 0 to nbias. This ensures that two inputs to a Schmitt trigger device are well controlled and follows PAD without any reliability issues. Therefore, the transmission gate 1802 as shown in FIG. 18 can also be used to short pad_top and pad_bot at lower supply voltages (say 1.2V, 1.5V of vcco) to ensure that both pad_bot and pad_top attains full swing.

Figure 20:
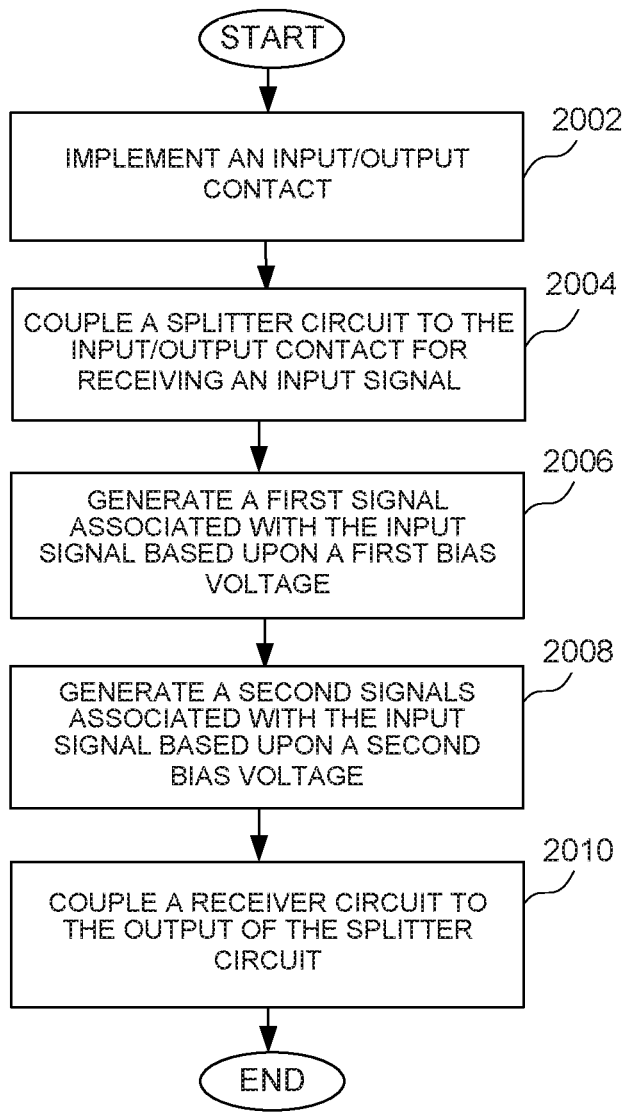
FIG. 20 is a flow chart showing a method of implementing a receiver arrangement having a pad splitter and a transmission gate.

Turning now to FIG. 20, a flow chart shows another method of implementing IO connections in an integrated circuit device. An input/output contact is implemented at a block 2002. A splitter circuit, such as the splitter circuit 216 of FIG. 17 is coupled to the input/output contact for receiving an input signal at a block 2004. A first signal associated with the input signal based upon a first bias voltage is generated at a block 2006. A second signal associated with the input signal based upon a second bias voltage generated at a block 2008. The first signal may be the pad_top signal based upon the pbias signal, and the second signal may be the pad_bot signal based upon the nbias signal. A receiver circuit is coupled to the output of the splitter circuit at a block 2010.

According to some implementations, the first circuit for generating a first signal associated with the input signal based upon a first bias voltage may comprise a p-type transistors and the first bias voltage is a pbias voltage, and the second circuit for generating a second signals associated with the input signal based upon a second bias voltage comprises a n-type transistors and the second bias voltage is a nbias voltage. The method may further comprise coupling a transmission gate, such as transmission gate 1802, between an output of the first circuit for generating a first signal and an output of the second circuit for generating a second signal, wherein the transmission gate enables shorting the output of the first circuit and the output of the second circuit during a predetermined mode of operation. The method may also comprise shorting the output of the first circuit and the output of the second circuit during a low voltage mode of operation.

The method of FIG. 20 may be implemented using the circuits of FIGS. 1-2 and 17-19 as described, or using some other suitable circuits. While specific elements of the method are described, it should be understood that additional elements of the method, or additional details related to the elements, could be implemented according to the disclosure of FIGS. 1-2 and 17-19.

Figure 21:
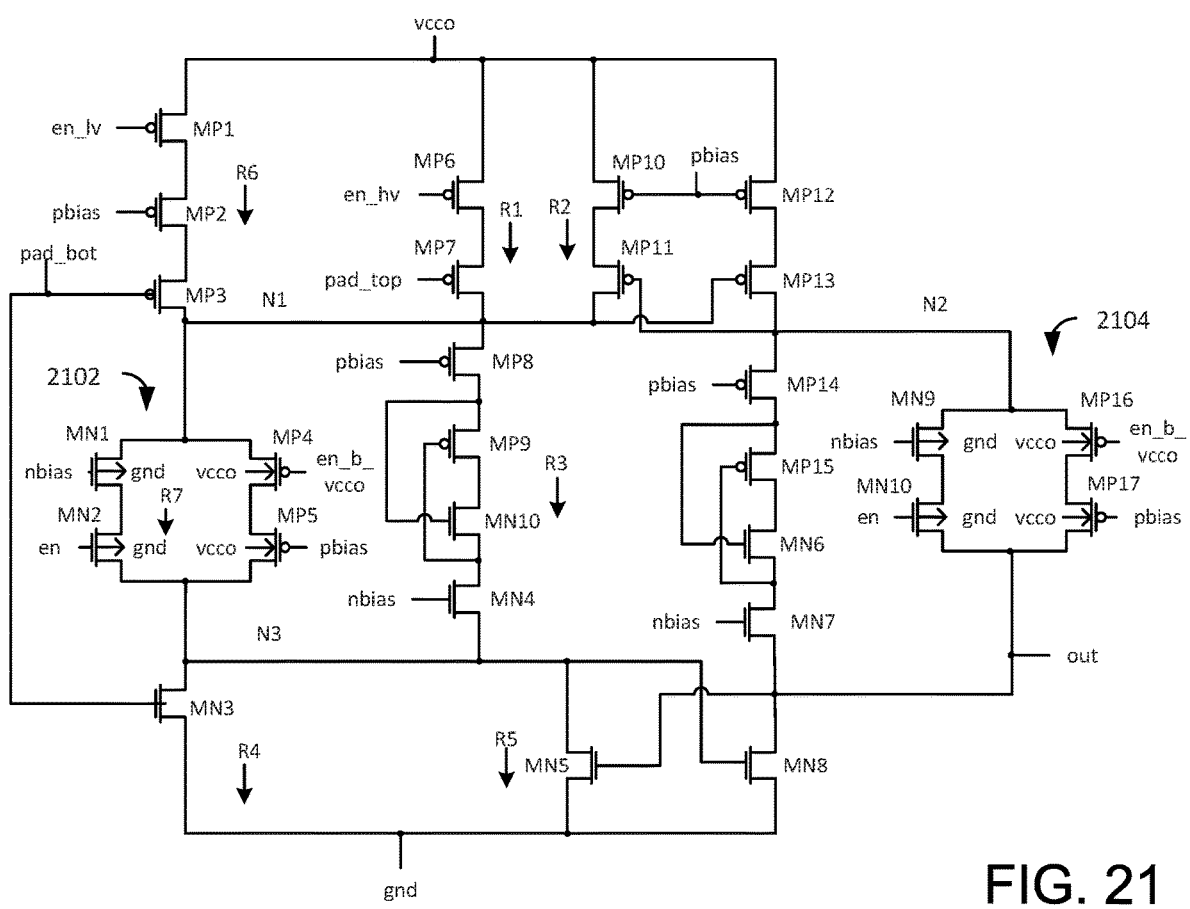
FIG. 21 is a schematic diagram depicting an example of a receiver.

FIG. 21 is a schematic diagram depicting an example of the receiver 218, which may be a wide range receiver. With advancements in technology and shrinking transistor dimensions, IO transistors (p-channel and n-channel) have lower maximum voltages across any two terminals thereof (e.g., 1.89 V). Therefore, in the HV mode (e.g., vcco=3.3 V or 2.5 V), techniques are needed to restrict the voltage difference between any two terminals of the IO transistors. A bias generator may generate different bias voltages depending on the operational mode (HV or LV). Likewise, different control voltages may be generated depending on the operational mode (HV or LV). The splitter circuit 216 generates the pad_top and pad_bot voltages from the pad voltage (i.e., the voltage on the pad 214) depending on the mode, as described further below. The receiver 218 may be a Schmitt Trigger that combines two receivers into a single entity that supports an entire vcco range (e.g., 3.3 V to 1.2 V) and may be considered a wide-range receiver. Examples of the receiver 218 are described further below.

The receiver 218 includes p-channel transistors MP1 through MP17, an n-channel transistor MN10, and n-channel transistors MN1 through MN10. A source of the transistor MP1 is coupled to the supply node vcco. A drain of the transistor MP1 is coupled to a source of the transistor MP2. A drain of the transistor MP2 is coupled to a source of the transistor MP3. A drain of the transistor MP3 is coupled to a node N1. A gate of the transistor MP1 receives a control voltage en_lv (generated by a control circuit for example). A gate of the transistor MP2 receives a bias voltage pbias (generated by the bias generator 308). A gate of the transistor MP3 is coupled to a node pad_bot (output by the splitter circuit 216).

A source of the transistor MP6 is coupled to the supply node vcco. A drain of the transistor MP6 is coupled to a source of the transistor MP7. A drain of the transistor MP7 is coupled to the node N1. A gate of the transistor MP6 receives a control voltage en_hv, which may be generated by a control circuit for example. A gate of the transistor MP7 is coupled to a node pad_top (output by the splitter circuit 216).

A source of the transistor MP10 is coupled to the supply node vcco. A drain of the transistor MP10 is coupled to a source of the transistor MP11. A drain of the transistor MP11 is coupled to the node N1. A source of the transistor MP12 is coupled to the supply node vcco. A drain of the transistor MP12 is coupled to a source of the transistor MP13. A drain of the transistor MP13 is coupled to a node N2. A gate of the transistor MP10 is coupled to a gate of the transistor MP12, each of which is also coupled to the node supplying the bias voltage pbias. A gate of the transistor MP13 is coupled to the node N1. A gate of the transistor MP11 is coupled to the node N2.

Substrate terminals of the transistors MN1 and MN2 are coupled to the ground node gnd. Substrate terminals of the transistors MP4 and MP5 are coupled to the supply node vcco. One source/drain of the transistor MN1 is coupled to the node N1, and the other source/drain of the transistor MN1 is coupled to a source/drain of the transistor MN2. The other source/drain of the transistor MN2 is coupled to a node N3. Likewise, one source/drain of the transistor MP4 is coupled to the node N1, and the other source/drain of the transistor MP4 is coupled to a source/drain of the transistor MP5. The other source/drain of the transistor MP5 is coupled to the node N3. A gate of the transistor MN1 is coupled to receive a bias voltage nbias. A gate of the transistor MN2 is coupled to receive a control voltage enable (en). A gate of the transistor MP5 is coupled to receive the bias voltage pbias. A gate of the transistor MP4 is coupled to receive a control voltage en_b_vcco. The transistors MN1, MN2, MP4, and MP5 form a transmission gate 2102.

A source of the transistor MP8 is coupled to the node N1. A drain of the transistor MP8 is coupled to a source of the transistor MP9. A drain of the transistor MP9 is coupled to a drain of the transistor MN10. A source of the transistor MN10 is coupled to a drain of the transistor MN4. A source of the transistor MN4 is coupled to the node N3. A gate of the transistor MP8 is coupled to the bias node pbias. A gate of the transistor MN4 is coupled to the bias node nbias. A gate of the transistor MN10 is coupled to the drain of the transistor MP8. A gate of the transistor MP9 is coupled to the drain of the transistor MN4.

A source of the transistor MP14 is coupled to the node N2. A drain of the transistor MP14 is coupled to a source of the transistor MP15. A drain of the transistor MP15 is coupled to a drain of the transistor MN6. A source of the transistor MN6 is coupled to a drain of the transistor MN7. A source of the transistor MN7 is coupled to the out node. A gate of the transistor MP14 is coupled to the bias node pbias. A gate of the transistor MN7 is coupled to the bias node nbias. A gate of the transistor MN6 is coupled to the drain of the transistor MP14. A gate of the transistor MP15 is coupled to the drain of the transistor MN7.

Substrate terminals of the transistors MN9 and MN10 are coupled to the ground node gnd. Substrate terminals of the transistors MP16 and MP17 are coupled to the supply node vcco. One source/drain of the transistor MN9 is coupled to the node N2, and the other source/drain of the transistor MN9 is coupled to a source/drain of the transistor MN10. The other source/drain of the transistor MN10 is coupled to the out node. Likewise, one source/drain of the transistor MP16 is coupled to the node N2, and the other source/drain of the transistor MP16 is coupled to a source/drain of the transistor MP17. The other source/drain of the transistor MP17 is coupled to the out node. A gate of the transistor MN9 is coupled to receive the bias voltage nbias. A gate of the transistor MN10 is coupled to receive a control voltage en. A gate of the transistor MP17 is coupled to receive the bias voltage pbias. A gate of the transistor MP16 is coupled to receive a control voltage en_b_vcco. The transistors MN9, MN10, MP16, and MN17 form a transmission gate 2104.

A drain of the transistor MN3 is coupled to the node N3. A source of the transistor MN3 is coupled to the node gnd. A gate of the transistor MN3 is coupled to the node pad_bot. A drain of the transistor MN5 is coupled to the node N3. A source of the transistor MN5 is coupled to the node gnd. A drain of the transistor MN8 is coupled to the out node. A source of the transistor MN8 is coupled to the node gnd. A gate of the transistor MN8 is coupled to the node N3. A gate of the transistor MN5 is coupled to the out node.

The bias and enable voltages for the HV and LV mode are summarized in Table 2.

TABLE 2

| Voltage Condition | en | en_b_vcco | pbias | nbias | en_hv | en_lv |
|---|---|---|---|---|---|---|
| HV | 0 | vcco | vcco-1.8 | 1.8 | pbias | vcco |
| LV | vcco | 0 | 0 | vcco | vcco | 0 |

Table 3 summarizes the voltage range of pad_top and pad_bot generated by the splitter circuit 216 for the HV and LV modes (where vtn and vtp are the threshold voltages of n-channel and p-channel transistors, respectively).

TABLE 3

| Voltage Condition | PAD | pad_bot | pad_top |
|---|---|---|---|
| HV | 0 to vcco | 0 to nbias-vtn | Pbias+vtp to vcco |
| LV | 0 to vcco | 0 to vcco | 0 to vcco |

In HV mode, the splitter circuit 216 generates pad_top and pad_bot voltages as described in Table 3. The voltage pad_bot does ramp up and clips at (nbias-vtn). The voltage pad_top starts at (pbias+vtp) and ramps up to 3.3. The voltage pad_bot then ramps down to 0. The voltage pad_top then ramps down to (pbias+vtp). This ensures that transistors MP3, MP7, and MN3 operate within reliable limits (i.e., the voltage between any two terminals does not exceed a maximum voltage, e.g., 1.8 V). In LV mode, the splitter circuit 216 generates pad_top and pad_bot to be the same voltage. For example, the splitter circuit 216 can short pad_top and pad_bot using a transmission gate, as described above.

Assume HV mode. At time t1 of FIG. 19, transistor MP3 is off, as en_lv is equal to vcco. Both of the transmission gates 2102 and 2104 are off due to the state of the control voltages en and en_b_vcco. The voltage pad_bot is 0 and the voltage pad_top is (pbias+vtp). The transistors MP6 . . . MP9, MN10, and MN4 are on. This sets the node N1 to vcco and the node N3 to (nbias–vtn). The transistor MP13 is off. The transistors MP14, MP15, and MN6 . . . MN8 are on. As such, the out node is at 0V and node N2 is at (pbias+vtp). This sets the transistors MP11 and MP10 to on. All transistors are in the linear region. Assume the effective resistance of the transistors MP6 and MP7 is R1; the effective resistance of transistors MP10 and MP11 is R2; the effective resistance of transistors MP8, MP9, MN10, and MN4 is R3; and the effective resistance of transistor MN3 is R4. The resistance R4 is high-impedance at t1 since the transistor MN3 is off.

Assume HV mode and time t1 to t3. As pad_bot increases, R4 reduces. As pad_top increases, R1 increases. There is contention between R4 and the parallel combination of R1 and R2 (R1//R2). At some point, R4 becomes sufficiently small compared to (R1//R2)+R3 that it pulls the node N3 to ground and the node N1 to pbias+vt. This turns off the transistor MN8 and turns on the transistor MP13. The node N2 becomes vcco, effectively shutting off R2. This trigger point (point 1912 in FIG. 19), occurring at time T2, is referred to as input high threshold (VIH).

Assume HV mode and time t3. Pad_top reaches vcco, which turns off the transistor MP7. As such, R1 becomes high-impedance. Node N3 becomes ground (gnd) and node N1 goes to pbias+vtp. The node N2 goes to vcco, thus shutting off R2. The output node goes to nbias-vtn, which is the output of the Schmitt trigger. R2 is shut off and the transistor MN5 turns on, providing effective resistance R5. The circuit is ready for high-to-low transition.

Assume HV mode and time t3 to t5. Pad_top moves from vcco towards pbias and pad_bot falls from nbias to 0. During the transition, R4 increases and R1 reduces. R1 is in contention with (R4//R5)+R3. At some point (e.g., T4), R1<< (R4//R5+R3), and the circuit triggers node N1 to be vcco. This switching point at t4 (1914 in FIG. 19) is referred to as input low threshold (VIL). The node N1 goes to vcco and the node N3 goes to nbias-vtn. This trigger sets latching into action, forcing the node N2 to pbias+vtp and the output node to 0 due to regenerative feedback. VIH can be independently fine-tuned by sizing MP10 and MP11. VIL can be independently fine-tuned by sizing MN5. Thus, hysteresis for the circuit can be fine-tuned (hysteresis=VIH–VIL). For coarse correction, decreasing R1 or increasing R4 will increase VIL and VIH together. The opposite will reduce VIL and VIH together. R3 will control the amount of current drawn when the input slew is very slow. Duty cycle distortion (DCD) can be controlled by sizing MP12, MP13, and MN8 appropriately.

It can be further observed that, during the entire cycle from t1 to t5, the voltage of all nodes is such that any two terminals of a transistor do not exceed a maximum voltage (e.g., 1.89 V). MP9 and MN10 helps to slow charging and discharging of the node between them and helps reduce stress (e.g., HCI) during high-frequency operation.

In LV mode, the receiver 218 operates similar to the HV mode described above with the following exceptions. The splitter circuit 216 shorts pad_top and pad_bot to make them equivalent to the input pad 214. Other conditions of the bias and control voltages are shown above in Table 2. Both of the transmission gates 2102 and 2104 are on so that the node N1 is coupled to the node N3 and the node N2 is coupled to the out node. The effective resistance of the transmission gate 2102 is R7. The resistance R7 is in parallel with the resistance R3. However, the resistance R7<<R3, so the resistance R7 effectively replaces the resistance R3 present in the HV mode. At time t1, pad_bot is 0. The effective resistance of MP1, MP2, and MP3 is R6. The parallel combination of R6 and R2 is in contention with R4 when the input rises, which determines the trigger VIH. The parallel combination of R4 and R5 is in contention with R6 when the input falls, which determines the trigger VIL.

Figure 22:
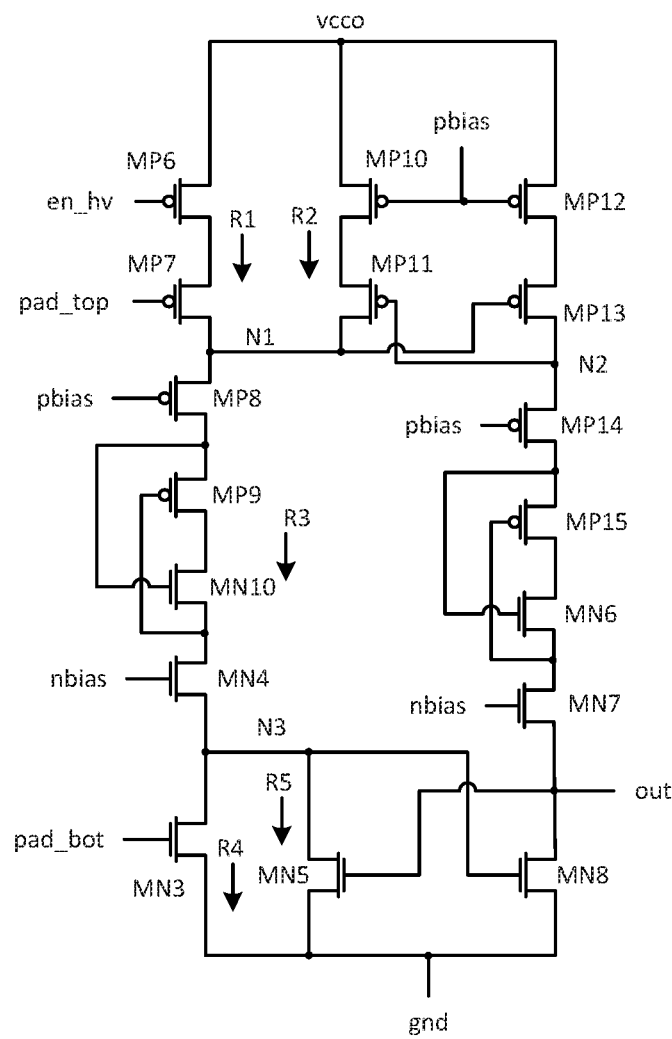
FIG. 22 shows the receiver of FIG. 21 in a high-voltage mode.
Figure 23:
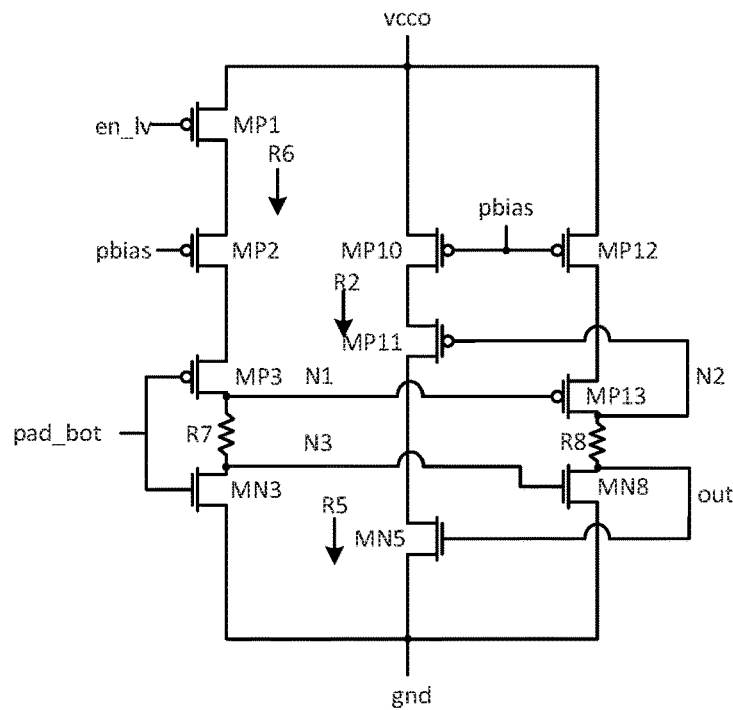
FIG. 23 shows the receiver of FIG. 21 in a low-voltage mode.

The receiver 218 combines two receivers, where one receiver is enabled in HV mode and the other receiver is enabled in LV mode. FIG. 22 shows a receiver $218_{HV}$ formed in the HV mode. The receiver $218_{HV}$ results from opening the transmission gates 2102 and 2104, enabling HV mode, and disabling LV mode. FIG. 23 shows a receiver $218_{LV}$ formed in the LV mode. The receiver $218_{LV}$ results from closing the transmission gates 2102 and 2104, disabling HV mode, and enabling LV mode. Closing the transmission gate 2102 couples nodes N1 and N3 through the effective resistance R7 of the transmission gate 2102. Likewise, closing the transmission gate 2104 couples the nodes N2 and out through an effective resistance R8 of the transmission gate 2104. Note the structures of the receiver $218_{HV}$ and $218_{LV}$ shown in FIGS. 22 and 23 are examples. The framework for combining two receivers can be used to combine receivers having other structures than shown in FIGS. 22 and 23.

Under certain conditions, switching between two receivers may not be desirable (to remove glitches). In such cases, the control voltage en_lv can be used to enable/disable the receiver 218 and the control voltage en_hv can be optionally turned ON or OFF to meet specification in the HV mode. This also ensures glitch-less operation of the receiver 218. Once enabled, the control voltage en_lv is always ON (pbias) regardless of vcco. The control voltage en_hv turns ON or OFF based on vcco (e.g., if vcco is 2.5 V or 3.3 V, en_hv is pbias; if vcco is 1.8 V or less, en_hv is vcco). Thus, ensures that whenever there is a transition from LV to HV mode or vice-versa, one leg controlled by en_lv is always on and switching of en_hv based on vcco will add parallel resistance (since Schmitt receivers never go into three-state, there is no glitch).

Figure 24A:
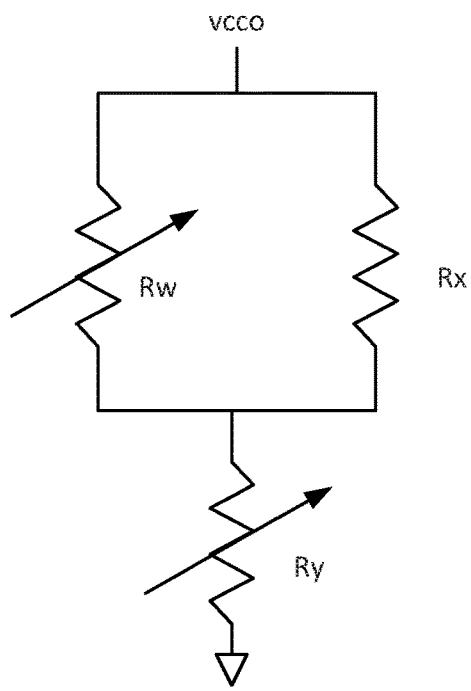
FIG. 24A and FIG. 24B illustrate an operation of the receiver of FIG. 21.
Figure 24B:
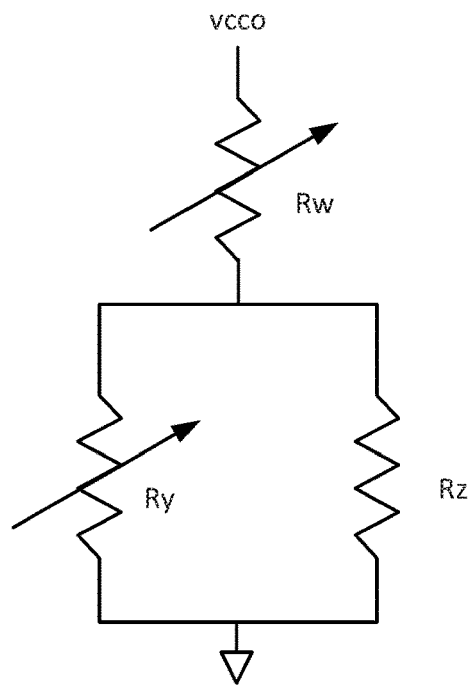

FIGS. 24A and 24B illustrate operation of the receiver 218. FIG. 24A illustrates operation as the receiver 218 approaches the VIH trigger. FIG. 24B illustrates operation as the receiver 218 approaches the VIL trigger. As shown in FIG. 24A, during the rise transition, Rw (which is increasing with respect to the rise transition) is in parallel with Rx (a constant resistance). The parallel combination is in contention with Ry, which is reducing with respect to the rise transition. The point at which switching occurs due to contention gives rise to VIH. As shown in FIG. 24B, during a fall transition, Rw (which is reducing with respect to the fall transition) is in contention with the parallel combination of Ry (which is increasing with respect to the fall transition) in parallel with Rz (a constant resistance) to achieve VIL.

Figure 25:
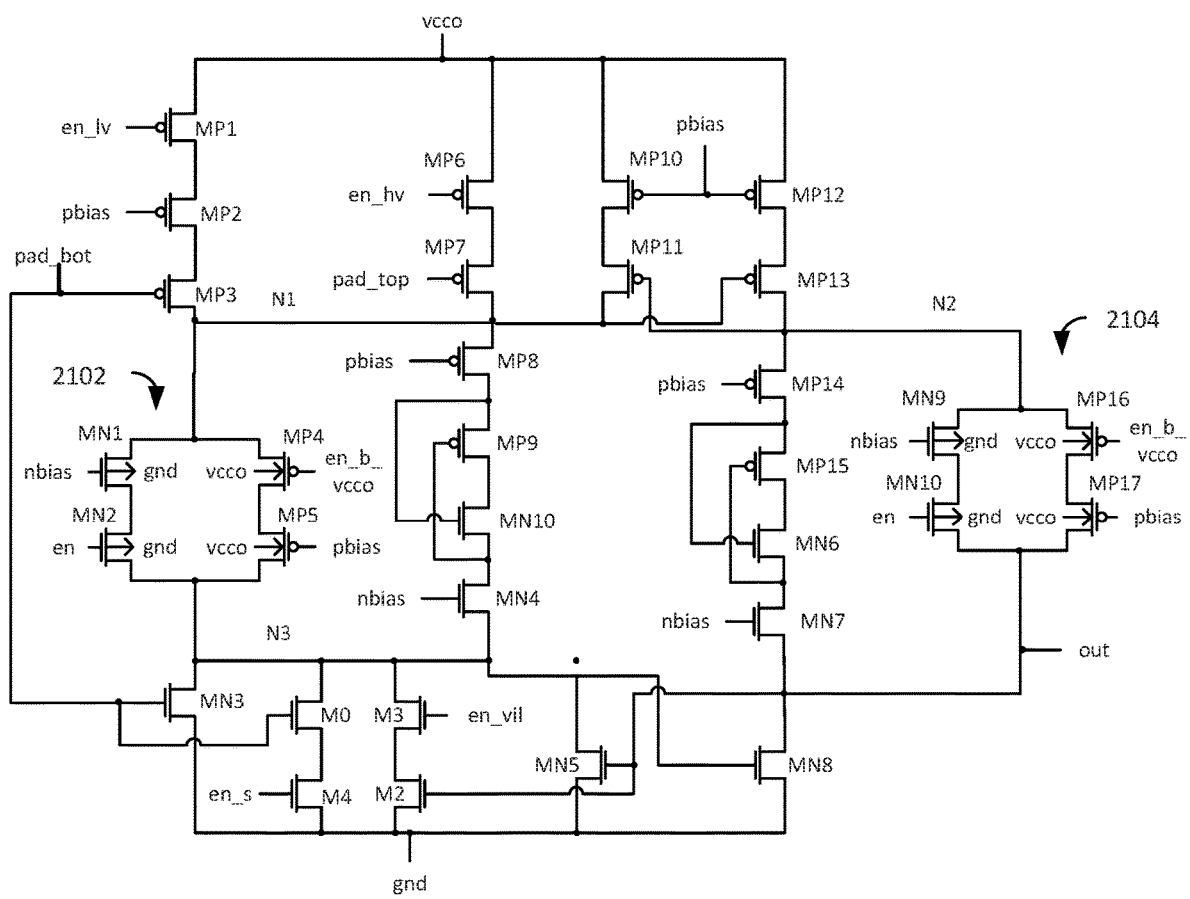
FIG. 25 is a schematic diagram depicting another example of a receiver.

FIG. 25 is a schematic diagram depicting another example of the receiver 218. Elements in FIG. 25 that are the same or similar to those of FIG. 21 are designated with identical reference numerals and described in detail above. In the present example, transistors M0, M2, M3, and M4 are added to the receiver 218. A drain of the transistor M0 is coupled to the N3. A source of the transistor M0 is coupled to a drain of the transistor M4. A source of the transistor M4 is coupled to the gnd node. A drain of the transistor M3 is coupled to the node N3. A source of the transistor M3 is coupled to a drain of the transistor M2. A source of the transistor M2 is coupled to the gnd node. A gate of the transistor M0 is coupled to pad_bot. A gate of the transistor M2 is coupled to the node N3. The gate of the transistor M4 receives a control voltage en_s. The gate of the transistor M3 receives a control voltage en_vil. The transistors M0 and M4 can be used to program (increase/decrease) VIH and VIL together. The transistors M2 and M3 can be used to program (increase/decrease) VIL individually. In another example (not explicitly shown), similar p-channel transistors can be added between the nodes N2 and vcco to control VIH independently.

The receiver 218 shown in FIG. 21 provides the framework for combining a low-voltage Schmitt receiver with a high-voltage Schmitt receiver, example structures of which are shown in FIGS. 22-23. The receiver 218 reduces area and power consumption with respect to separate implementations of high-voltage and low-voltage Schmitt receivers. The receiver 218 further provides for glitch-free operation, as described above.

Figure 26:
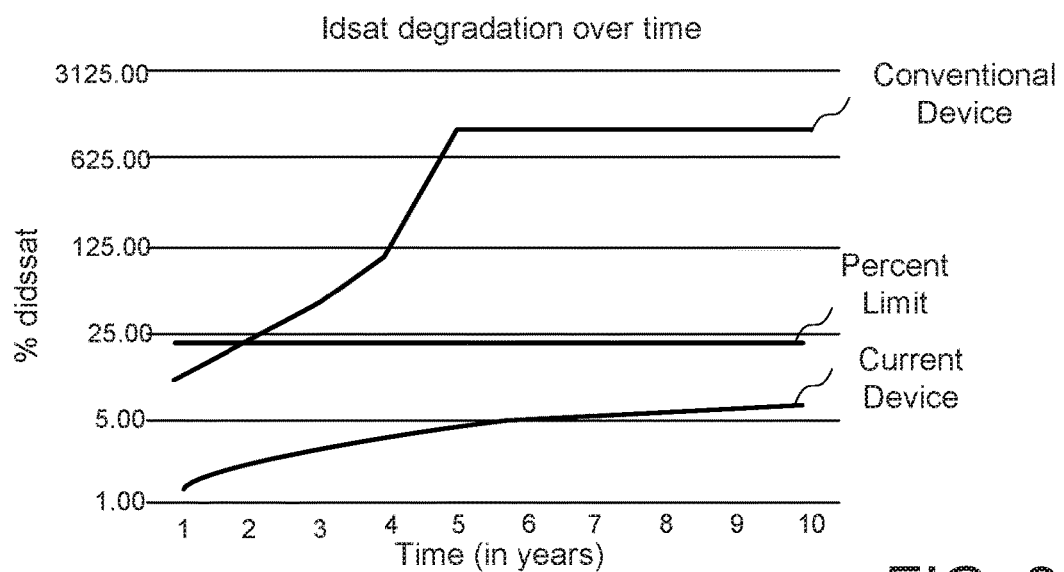
FIG. 26 is a timing diagram showing Idsat degradation with respect to time.
Figure 27:
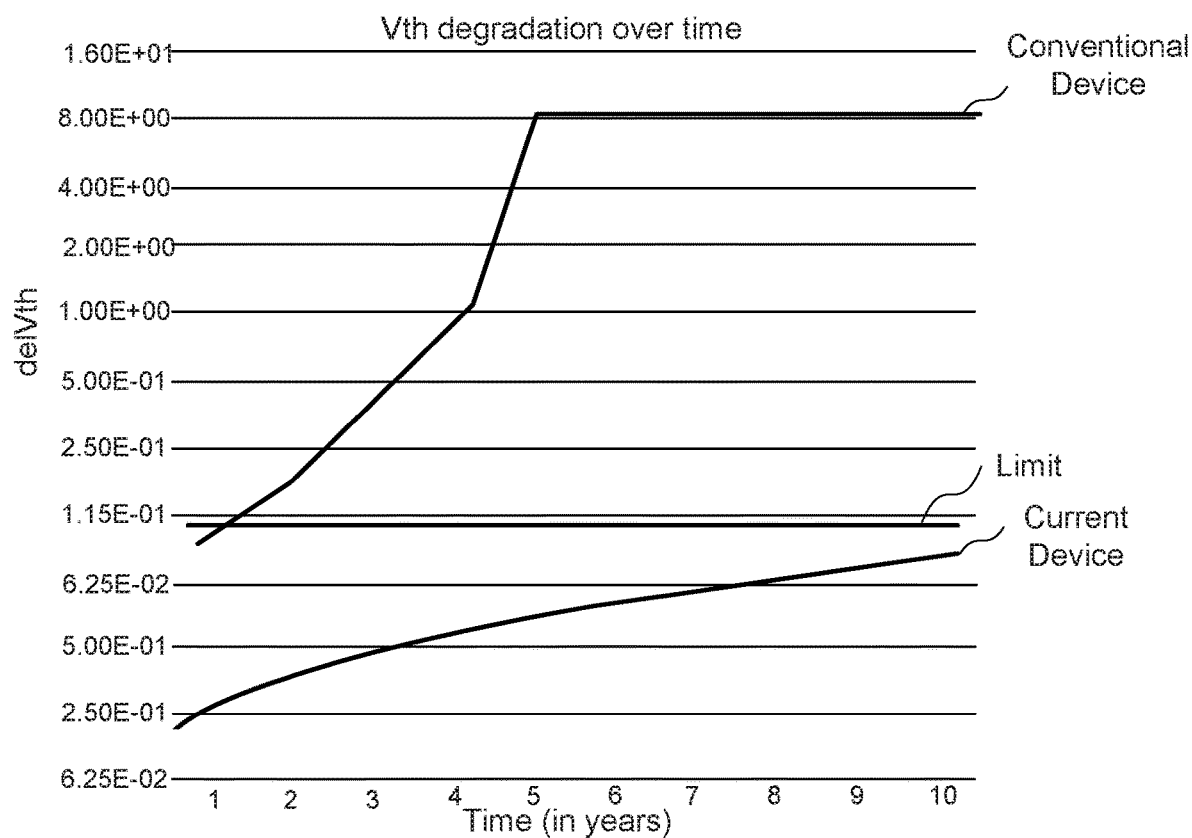
FIG. 27 is a timing diagram showing Vth degradation with respect to time.

The timing diagram of FIG. 26 shows drain current saturation (Idsat) degradation as a percentage of the drain current saturation with respect to time, while the timing diagram of FIG. 27 shows transistor threshold voltage degradation (delVth) in volts with respect to time in devices implementing the circuits and methods including a triple stack driver arrangement and dynamic biasing as set forth above. As can be seen, the circuits and methods may extend the life time of integrated circuit devices a triple stack driver arrangement and dynamic biasing to IO years or more according to simulation estimates.

It can therefore be appreciated that new circuits and methods of implementing connections in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for implementing an input/output connection in an integrated circuit device, the circuit comprising:
    a pull-up circuit comprising a first plurality of transistors coupled in series, wherein a gate of a first transistor of the first plurality of transistors is configured to receive a first dynamic bias signal and a drain of the first transistor is coupled to an output node;
    a pull-down circuit comprising a second plurality of transistors coupled in series, wherein a gate of a second transistor of the second plurality of transistors is configured to receive a second dynamic bias signal, the second dynamic bias signal different than the first dynamic bias signal, wherein a drain of the second transistor is coupled to the output node;
    an input/output contact coupled to the output node; and
    an internal input/output signal generator circuit coupled to the output node, configured to generate an internal IO contact voltage signal based on an input/output contact voltage of the input/output contact, and comprising:
        a first series of transistors comprising a first transistor having a gate configured to receive a first bias signal, a second transistor having a gate configured to receive a first supply voltage, and a third transistor having a gate configured to receive the first bias signal and a drain coupled to an internal contact node; and
        a second series of transistors comprising a first transistor having a gate configured to receive a second bias signal, a second transistor having a gate configured to receive a second supply voltage, and a third transistor having a gate configured to receive the second bias signal and a source coupled to the internal contact node, wherein the first dynamic bias signal and the second dynamic bias signal dynamically change based on the input/output contact voltage, wherein a minimum voltage of the first dynamic bias signal is greater than a minimum voltage of the input/output contact voltage, and a maximum voltage of the second dynamic bias signal is less than a maximum voltage of the input/output contact voltage; and wherein the first transistor and the third transistor of the first series of transistors are p-type transistors, and the second transistor of the first series of transistors is an n-type transistor, and wherein the first transistor and the third transistor of the second series of transistors are n-type transistors, and the second transistor of the second first series of transistors is a p-type transistor.

2. The circuit of claim 1, wherein a third transistor of the first plurality of transistors has a gate configured to receive the first bias signal, and wherein a fourth transistor of the second plurality of transistors has a gate configured to receive the second bias signal.

3. The circuit of claim 1, further comprising:
a bias signal generator comprising:
a first bias signal generator circuit for generating the first dynamic bias signal; and
a second bias signal generator circuit for generating the second dynamic bias signal.

4. The circuit of claim 3, wherein the first bias signal generator circuit comprises a first pair of transistors coupled between the output node and a node configured to receive the first bias signal, wherein a first transistor of the first pair of transistors has a gate configured to receive the first bias signal and a second transistor of the first pair of transistors has a gate configured to receive the internal IO contact voltage signal.

5. The circuit of claim 4, wherein the second bias signal generator circuit comprises a second pair of transistors coupled between the output node and a node configured to receive the second bias signal, wherein a first transistor of the second pair of transistors has a gate configured to receive the second bias signal and a second transistor of the second pair of transistors has a gate configured to receive the internal IO contact voltage signal.

6. The circuit of claim 5, wherein the first bias signal generator circuit further comprises a third pair of transistors coupled between the output node and the node configured to receive the first bias signal, and the second bias signal generator circuit further comprises a fourth pair of transistors coupled between the output node and the node configured to receive the second bias signal.

7. The circuit of claim 1, wherein a fifth transistor of the first plurality of transistors comprises a gate configured to receive a first data input, a source configured to be coupled to a first supply voltage, and a drain coupled to a source of the third transistor, and wherein a sixth transistor of the second plurality of transistors comprises a gate configured to receive a second data input different than the first data input, a drain coupled a source of the fourth transistor, and a source configured to receive a second supply voltage.

8. The circuit of claim 1, wherein a maximum voltage of the first dynamic bias signal is less than the maximum voltage of the input/output contact voltage and a minimum voltage is of the second dynamic bias signal is greater than the minimum voltage of the input/output contact voltage.

9. The circuit of claim 1, wherein a maximum voltage of the internal IO contact voltage signal is less than the maximum voltage of the input/output contact voltage, and a minimum voltage of the internal IO contact voltage signal is greater than the minimum voltage of the input/output contact voltage.

10. The circuit of claim 1, wherein the second transistor of the first series of transistors is disposed between the first transistor of the first series of transistors and the third transistor of the first series of transistors, and wherein the second transistor of the second series of transistors is disposed between the first transistor of the second series of transistors and the third transistor of the second series of transistors.

11. The circuit of claim 1, wherein a drain of the first transistor of the first series of transistors is connected to a drain of the second transistor of the first series of transistors, and a source of the second transistor of the first series of transistors is connected to a source of the third transistor of the first series of transistors, and wherein a source of the first transistor of the second series of transistors is connected to a source of the second transistor of the second series of transistors, and a drain of the second transistor of the second series of transistors is connected to a drain of the third transistor of the second series of transistors.

12. A method of implementing an input/output connection in an integrated circuit device, the method comprising:
implementing a pull-up circuit comprising a first plurality of transistors coupled in series;
configuring a gate of a first transistor of the first plurality of transistors to receive a first dynamic bias signal;
coupling a drain of the first transistor to an output node;
coupling a pull-down circuit comprising a second plurality of transistors coupled in series to the pull-up circuit at the output node;
configuring a gate of a second transistor of the second plurality of transistors to receive a second dynamic bias signal, the second dynamic bias signal different than the first dynamic bias signal;
coupling a drain of the second transistor to the output node;
coupling an input/output contact to the output node;
coupling an internal input/output signal generator circuit to the output node, the internal input/output signal generator circuit comprising a first series of transistors and a second series of transistors, and configured to generate an internal IO contact voltage signal based on an input/output contact voltage of the input/output contact;
coupling a gate of a first transistor of the first series of transistors to a first bias signal, a gate of a second transistor of the first series of transistors to a first supply voltage, a gate of a third transistor of the first series of transistors to the first bias signal, and a drain of the third transistor of the first series of transistors to an internal contact node; and
coupling a gate of a first transistor of the second series of transistors to a second bias signal, a gate of a second transistor of the second series of transistors to a second supply voltage, a gate of a third transistor of the second series of transistors to the second bias signal, and a source of the third transistor of the second series of transistors to the internal contact node;

wherein the first dynamic bias signal and the second dynamic bias signal dynamically change based on an input/output contact voltage of the input/output contact;

wherein a minimum voltage of the first dynamic bias signal is greater than a minimum voltage of the input/output contact voltage, and a maximum voltage of the second dynamic bias signal is less than a maximum voltage of the input/output contact voltage; and wherein the first transistor and the third transistor of the first series of transistors are p-type transistors, and the second transistor of the first series of transistors is an n-type transistor, and wherein the first transistor and the third transistor of the second series of transistors are n-type transistors, and the second transistor of the second series of transistors is a p-type transistor.

13. The method of claim 12 further comprising:
configuring a gate of a third transistor of the first plurality of transistors to receive the first bias signal, and a gate of a fourth transistor of the first plurality of transistors to receive a first data signal; and
coupling a source of the fourth transistor to a first supply voltage and a drain of the fourth transistor to a source of the third transistor.

14. The method of claim 13 further comprising:
configuring a gate of a fifth transistor of the second plurality of transistors to receive the second bias signal, and a gate of a sixth transistor of the second plurality of transistors to receive a second data signal, wherein the second data signal is different the first data signal; and
coupling a drain of the sixth transistor to a source of the fifth transistor, and a source of the sixth transistor to a second power supply.

15. The method of claim 12, further comprising coupling a bias signal generator to the pull-up circuit and the pull-down circuit, the bias signal generator comprising a first bias signal generator circuit for generating the first dynamic bias signal and a second bias signal generator circuit for generating the second dynamic bias signal.

16. The method of claim 15, wherein the first bias signal generator circuit comprises a first pair of transistors coupled between the output node and a node receiving the first bias signal, wherein a first transistor of the first pair of transistors has a gate configured to receive the first bias signal and a second transistor of the first pair of transistors has a gate configured to receive the internal IO contact voltage signal.

17. The method of claim 16, wherein the second bias signal generator circuit comprises a second pair of transistors coupled between the output node and a node receiving the second bias signal, wherein a first transistor of the second pair of transistors has a gate configured to receive the second bias signal and a second transistor of the second pair of transistors has a gate configured to receive the internal IO contact voltage signal.

18. The method of claim 17, wherein a maximum voltage of the internal IO contact voltage signal is less than the maximum voltage of the input/output contact voltage, and a minimum voltage of the internal IO contact voltage signal is greater than the minimum voltage of the input/output contact voltage.

* * * * *